United States Patent
Mogilner et al.

(10) Patent No.: US 8,036,321 B2
(45) Date of Patent: Oct. 11, 2011

(54) MULTIPLE CHANNEL BALLAST AND NETWORKABLE TOPOLOGY AND SYSTEM INCLUDING POWER LINE CARRIER APPLICATIONS

(75) Inventors: Rafael Mogilner, Rehovot (IL); Boris Nogtev, Rishon Lezion (IL); Yuri Kuhlik, Sderot (IL); Daniel Rubin, Ness Ziona (IL); Arie Lev, Mazkeret Batya (IL); Eytan Rabinovitz, Rishon Lezion (IL)

(73) Assignee: S.T.L. Energy Solutions and Technologies Ltd., Rehovot (IL)

( * ) Notice: Subject to any disclaimer, the term of this patent is extended or adjusted under 35 U.S.C. 154(b) by 283 days.

(21) Appl. No.: 12/498,429

(22) Filed: Jul. 7, 2009

(65) Prior Publication Data

US 2010/0052731 A1 Mar. 4, 2010

Related U.S. Application Data

(60) Continuation of application No. 11/367,351, filed on Mar. 6, 2006, now Pat. No. 7,573,372, which is a division of application No. 10/449,065, filed on Jun. 2, 2003, now Pat. No. 7,009,348.

(60) Provisional application No. 60/384,410, filed on Jun. 3, 2002.

(51) Int. Cl.
*H04L 27/06* (2006.01)

(52) U.S. Cl. ........ 375/340; 375/341; 375/360; 375/143; 375/130; 375/140

(58) Field of Classification Search .......... 375/130–132, 375/135, 136, 140, 143, 146, 295, 316, 340, 375/341, 355, 358, 360; 463/39–42
See application file for complete search history.

(56) References Cited

U.S. PATENT DOCUMENTS

| | | | | |
|---|---|---|---|---|
| 6,354,946 | B1* | 3/2002 | Finn | 463/40 |
| 7,009,348 | B2* | 3/2006 | Mogilner et al. | 315/307 |
| 7,539,237 | B2* | 5/2009 | Fullerton | 375/149 |
| 7,573,372 | B2* | 8/2009 | Mogilner et al. | 340/12.32 |
| 7,656,931 | B2* | 2/2010 | Smith et al. | 375/131 |

* cited by examiner

*Primary Examiner* — Haiss Philogene
(74) *Attorney, Agent, or Firm* — Mark M. Friedman

(57) ABSTRACT

Control systems and methods for independent control of power systems, particularly lighting network branches, and separate control of individual branch components. Multi-branch systems comprise independently controllable branches that inter-communicate via PLC communications. In each branch, components such as ballasts, local control units, sensors, actuators, and repeaters, may exchange commands and queries independently of a branch remote control unit (BRCU). Alternatively, a BRCU may manage or arbitrate communications, or interact with other BRCUs, other control units and external management systems. Ballasts include a multi-channel ballast that enables close-loop control of individual fixtures, or of individual dimmable or non-dimmable lamps within a fixture. The close-loop control is facilitated by sampling circuits/sensors co-located with each controlled fixture or lamp. All controllers are preferably implemented using an integrated digital controller. The PLC communication is preferably carried out by a direct spread spectrum method that eliminates side lobes from a cross-correlation function, using an anti-collision protocol.

13 Claims, 26 Drawing Sheets

750

752

MULTIPLE CHANNEL BALLAST AND NETWORKABLE TOPOLOGY AND SYSTEM INCLUDING POWER LINE CARRIER APPLICATIONS

CROSS REFERENCE TO RELATED APPLICATIONS

This is a Continuation of U.S. patent application Ser. No. 11/367,351 filed Mar. 6, 2006, now U.S. Pat. No. 7,573,372 which is a Divisional of U.S. patent application Ser. No. 10/449,065 filed Jun. 2, 2003, now U.S. Pat. No. 7,009,348 which claims the benefit of priority from U.S. Provisional Application No. 60/384,410, filed Jun. 3, 2002, the contents of which are incorporated herein by reference.

FIELD AND BACKGROUND OF THE INVENTION

The present invention relates to systems and methods for control of power electronic applications, including their control over power lines by a CDMA (Code Division Multiple Access) DSSS (Direct Sequence Spread Spectrum) communication network, in particular for control system networks. The invention also relates to the control in close-loop of a number of lighting fixtures, or lamps within one fixture, by a single central ballast. The invention further relates to PLC (Power Line Carrier) communication control of large automation systems including HVAC (heating, ventilation, air-conditioning), security, fire alarm systems, etc. Existing PLC communication systems do not provide adequate and cost effective solutions to the control networks mentioned above.

The problem of controlling a number of fixtures or a number of lamps in one fixture by a single central ballast has been tackled for a long time by lighting engineers, with little success. In prior art, the control of all fixtures is typically done in open loop, by fixing one light level to all fixtures (having one feedback only), and by providing the power to the fixtures according to this parameter. The drawback of this approach is that the parameter variations between the lamps, the wiring, and the components at the level of the fixture, produce light dispersions that are intolerable to the eye. One example is the case of multiple fixture dimmable electronic ballasts (MFDEB), in which the power distribution from the central ballast to the individual fixture is not controlled in close-loop, and depends upon the length of the wiring and its characteristics. Another example is that of ballast that controls individually several lamps in one fixture.

There is therefore a need for, and it would be advantageous to have, methods and systems for advanced control of various power and other electronic systems. Moreover, it would be advantageous to control in close-loop, together or separately, a number of fixtures or a number of individual lamps by a single central ballast. Such a "central ballast control" would be beneficial in that it decreases the cost of the ballast per fixture, by having a single central high power ballast, and by distributing the power to several lighting fixtures or lamps. Furthermore, there is a need for an energy saving lighting system that can advantageously use such methods and systems.

SUMMARY OF THE INVENTION

The present invention discloses control systems in which branches of a larger system can act independently, as well as interact among themselves. One such exemplary control system is of a lighting system that has a central remote control unit (CRCU), and at least one front end module that comprises at least one branch remote control unit (BRCU) or remote control unit (RCU) that unifies the CRCU with the BRCU, or a local control unit (LCU) as described below. The BRCU is isolated from its electrical power source and from the other branches. The present invention also discloses a multiple-channel electronic ballast (MCB) that has at least one light fixture with one or more lamps. The lamps may be dimmable or non-dimmable. The MCB enables close-loop control from a central ballast of individual fixtures, in which case it is referred to as Multi Fixture Electronic Ballast or MFEB, and/or enables control of individual lamps within a fixture. The preferably close-loop control is aided by various sensors positioned in proximity to the individual fixture or lamp, and remote from the controller. The present invention also discloses an energy saving lighting system. The following description continues with an emphasis on lighting systems as best exemplifying the various aspects of the invention. However, the scope of the invention clearly covers other electronic control systems.

A major advantage of the present invention over prior art is that the sense and the control of the lighting are made individually for each fixture in a MFEB system, or for each lamp (or for more than one lamp in series) within one fixture. In use with dimmable lights, the MFEB is also referred to as a MFDEB. The MFEB is a central power supply for a multiplicity of lamps located at remote lamp fixtures. A "multi-lamp ballast" is a single power supply that controls individually a multiplicity of lamps located in a lamp fixture together with the ballast. For both multi fixture and multi lamp ballasts, the power topology for the lamp driver can be either a known half bridge topology, a full bridge topology, a push-pull topology, or a novel "economical half bridge" power topology having one common high side (HS) switch and multiple low side (LS) switches (or vice versa), as described below. Other applications may have more than one common HS switch operating together with a number of LS switches (or vice versa). In all cases, the fine control of the light level is achieved by using the feedback of the lamps current for each fixture, or the current of the single lamp in case of a single fixture. Control of "one lamp in a fixture" may refer to one lamp or several lamps connected in series. In a preferred embodiment, the sensing of additional parameters (such as temperature, cathode voltage, light intensity etc.) can be performed in close loop to achieve maximum efficiency, light quality, and extended lamp life.

The successful implementation of this invention is made possible by the fact that the sensing is done at the level of the fixture in the case of the MFEB, or at the level of the lamp for a single fixture, thus providing a true close-loop control of the light level for each fixture/lamp. An important inventive feature of the present invention is the method of power transmission from the MFEB to the light fixture, and the accurate sensing and accurate transmission of the lamp current feedback signal. This feedback allows the accurate control of the light level, and results in a uniform light level output of all the light fixtures controlled by the MFEB. This contrasts with the prior art, in which the light output of the different fixtures controlled by a central ballast has large variations, which are unacceptable to the customer or user. This stems from the fact that in prior art, for remote control of remote fixtures, the feedback is taken locally in the ballast and/or is common to all the lamps operated by the ballast.

In case of a single fixture application, additional advantages regarding energy saving can be achieved by the individual control of the lamps (like switching Off one lamp instead of dimming all of the lamps). Another advantageous aspect of the MFEB of the present invention is the possibility to provide central ballast power levels ranging from 250 W to 1000 W and beyond. This allows for example to design lighting systems having nine or more fixtures, each fixture being at different distances of more than 10 meters from the central ballast. After studying the present invention, one will appreciate that the number of fixtures that can be controlled using the systems and methods provided, is in principle unlimited.

Another outstanding aspect of this invention is that the ballast controller can perform also the function of an emergency system, by using efficiently the dimming capability and the individual switch-Off of the fixtures (or of the lamps in case of one fixture), to provide energy-efficient lighting in case of mains failure.

Yet another outstanding aspect of this invention is that the ballast controller can switch off individually each one of the fixtures in a MFEB, or each one of the lamps in a single fixture application. Furthermore, the ballast controller can dim individually each one of the fixtures/lamps, and monitor individually each one of the fixtures/lamps against any safety hazard (by measuring the voltage of each fixture/lamp or by performing additional measurements as required), as would have been done at the level of a single fixture control.

Yet another outstanding aspect of the present invention is that the control system has bi-directional communication capability either by PLC communication or by dedicated wiring, or by RF or IR remote control for digital control from an external source. The PLC communication is preferably a DSSS communication, explained below. The wire communication can be either PLC-DSSS, CAN, DALI, RS-485, or Microlan.

Although the MCB of the present invention may be implemented with various controllers, the multiple advanced capabilities listed herein are advantageously enabled by the use of an Integrated Digital Controller (IDC) with novel architecture disclosed in U.S. Patent Application No. 60/384,410. The IDC controls individually and remotely each fixture in a MFEB, or each lamp in one fixture. This is achieved by remotely sensing the fixture lamps discharge current, and by controlling it individually. The accuracy of the control depends on the accuracy of the power transmission. Hereinafter, any reference to "IDC" means preferably the IDC disclosed in the above mentioned application. We thus achieve a central digital high performance control system with a distributed power system. The overall result is a significant decrease in cost per fixture for dimmable systems as well as non-dimmable ones. Furthermore, the present invention, in combination with the use of the above mentioned IDC, allows design and production of hitherto unpractical fixtures such as single fixtures of 3, 4, or more lamps. The same apparatus can be applied to non-dimmable systems with the same effects of cost decrease and high performance.

Another outstanding feature of this invention is that the same ballast, using an IDC as controller, can be programmed to control a large number of lamp types by choosing the right set of parameters, which are already inscribed in the memory of the IDC. Alternatively, in case such a set of parameters is not yet defined, the ballast can be programmed to generate such a set of parameters in order to allow the control of a new type of lamp or a new MFEB configuration. This allows keeping in stock a single central ballast that can serve a large number of configurations or lamp types, thus decreasing drastically the level and type of products kept in stock. This attribute represents a technological and business model breakthrough.

According to the present invention there is provided a control system comprising a plurality of independently controllable branches, each branch including a branch remote control unit preferably including as controller an integrated digital chip disclosed in U.S. Patent Application No. 60/384,410, the branches connected to a common power source, and PLC communication means connecting the branches to allow inter-branch operability.

According to the present invention there is provided a control system comprising a branch control system comprising a BRCU that includes a PLC transceiver, the unit operative to provide and receive a plurality of analog and digital signals through the transceiver, and at least one branch component, operative to independently communicate with the BRCU through the PLC transceiver.

According to the present invention there is provided a multi-channel electronic ballast comprising a multi-channel central ballast controller operative to provide close-loop control to a plurality of discharge lamps, a lamps drivers array connected to the central ballast controller, and a lamps termination array driven by the lamp drivers array, the lamp termination array including a plurality of sampling circuits to provide feedbacks to the controller, each circuit associated with a different discharge lamp, whereby the multi-channel ballast controller enables closed-loop, rapid control of individual lamp functions in the system. In a most preferred embodiment of the multi-channel electronic ballast of the present invention, the ballast controller is an integrated digital chip disclosed in U.S. Patent Application No. 60/384,410.

According to the present invention there is provided an electronic ballast comprising a central ballast controller operative to provide close-loop control, at least one load driver connected to the central ballast controller, and at least one load remote from the controller and driven by the at least one driver, the at least one load including at least one sampling circuit for providing feedback signals used by the controller in the close-loop control.

According to one feature in the electronic ballast of the present invention, the load is at least one fixture, at least one discharge lamp, or a combination of at least one fixture and at least one discharge lamp.

According to the present invention there is provided a modular multi-fixture light system comprising a close-loop controllable multi-fixture ballast, a plurality of twisted pair cables for driving and feedback, the cables connected at one end to the ballast, and a plurality of fixtures having matching lamp terminations, each lamp termination connected at another end of a cable.

According to the present invention there is provided a remote control power system comprising at least one controlled power element, and close-loop controlling means for controlling each power element separately, from a central controller positioned remotely from the power element.

According to the present invention there is provided a method for remotely controlling at least one power load from a central control unit in close loop comprising the steps of providing a central controller operative to receive and provide a plurality of analog and digital signals, sensing a status parameter of the at least one power load and relaying the sensed parameter to the central controller, and in response to the sensing, outputting a command from the controller to change a state of the at least one power load.

According to the present invention there is provided a direct sequence spread spectrum (DSSS) communication method for reducing side-lobes in a signal having a main lobe defined by a correlation function of a short PN (Pseudo Noise) code, the method comprising the steps of detecting a coincidence between chip samples of the signal and a reference, and generating a 1 bit output value, integrating the output value to obtain an integrated value corresponding to the main lobe of correlation function of the signal. The DSSS communication allows the increase noise immunity using a very efficient algorithm that requires low processing resources.

According to the present invention there is provided a system for reducing side-lobes in a signal having a main lobe defined by a correlation function, the method comprising at least one symbol decoder having an output port, a delay line with n−1 taps in communication with the at least one symbol decoder, and comparison means within the at least one decoder to obtain an integrated output value at the output, whereby the output value is correlated with a coincidence between a combination of signal samples on the delay line and a reference.

According to one feature in the system for reducing side-lobes in a signal of the present invention, the comparison means include a plurality of XOR logic elements for comparing multiplied outputs of signals sampled through the delay line, the XOR elements feeding the result of the comparison to an OR logic element that outputs a one or zero signal used to calculate the integrated value.

According to the present invention there is provided a method for avoiding command collisions in a power line carrier communication network, comprising the steps of submitting, by at least two input/output units connected to the power line, short burst requests for transmitting commands, and, if the requests conflict in a same time frame, resubmit any rejected request until granted permission to transmit its respective command.

According to the present invention, the method for avoiding command collisions in a power line carrier communication network further comprises optionally arbitrating the short burst requests, and performing the granting or rejection based on the arbitration.

According to the present invention there is provided, in a network control system, a method for identifying and assigning specific physical locations to network components comprising the steps of automatically interrogating each network component, and based on a response from each interrogated component, allocating a physical location to the component.

BRIEF DESCRIPTION OF THE DRAWINGS

The invention is herein described, by way of example only, with reference to the accompanying drawings:

FIG. 4b shows a timing diagram for the topology of FIG. 4a;

FIG. 5a shows a multi-channel ballast connected optionally to assorted sensors;

DETAILED DESCRIPTION OF THE PREFERRED EMBODIMENTS

The present invention is of control systems and methods, preferably power control systems and methods for buildings, and of innovative components for such systems. The invention discloses an ESLS (energy saving lighting system) that enables load shedding and provides communication infrastructure for other systems such as HVAC, security, fire, environmental, etc. The ESLS has at least one front end module, which comprises at least one BRCU component that communicates with at least one controlled component through a galvanic isolated line coupler (e.g. a light fixture carrying at least one lamp) and with a LCU (local control unit) component. The LCU communicates with both the BRCU and the controlled component through a power line. The invention also discloses a system that enables close-loop control from a MCB (multi-channel ballast) of individual fixtures or individual lamps within a fixture. This MCB may be applied in an ESLS as the above mentioned controlled component. The ESLS uses an innovative power line carrier communication (PLC DSSS) method for communication between its components.

The principles and operation of the systems and methods provided by the present invention may be better understood with reference to the drawings and the accompanying description.

Energy Saving Lighting System

Figure 1:
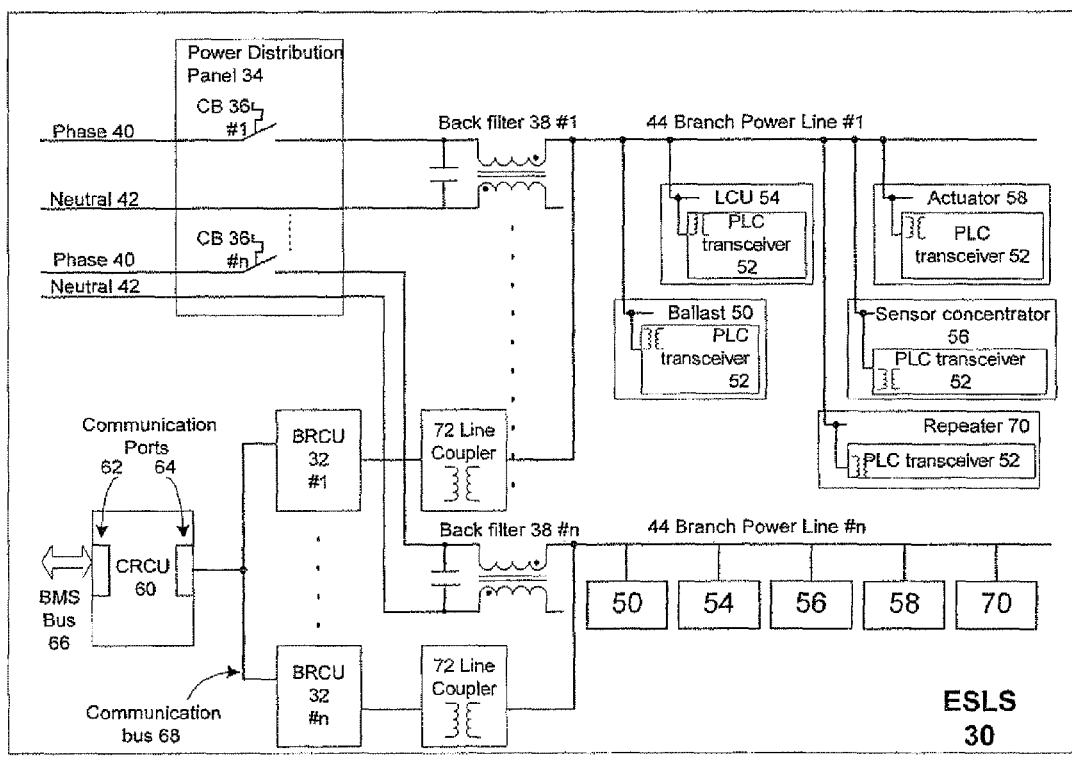
FIG. 1 is a schematic description of a general control system using PLC communication.

FIG. 1 shows a preferred embodiment of an ESLS system 30 that serves as an exemplary control system using PLC control communication signals. The system may also be referred to as a multi-branch control system. The ESLS system shown is comprised of a plurality of high frequency isolated power line branches 44, and the PLC communication spreads over several branches. The minimal ESLS configuration is comprised of five basic components: a branch power line 44, a BRCU 32, a line coupler 72, a branch back-filter 38, and "branch components" Branch components belong to a branch and include one or more of an EB ballast 50, a LCU 54, an actuator 58, a sensor concentrator 56, and optionally a repeater 70. The branch components, each separately or in any combination, are operative to transmit and receive PLC communication signals by means of PLC transceivers 52. This minimal configuration can be considered a subsystem that operates stand-alone. BRCU 32 is the interface between the branch and the outside world (i.e a CRCU 60 and other branches) It can, in certain protocols, serve as an Arbiter of the PLC communication signals within the branch, or as a gate that allows the branch components to communicate with components of another branch, or with an external management system such as a Building Management System (BMS). Moreover, BRCU 32 can serve as a manager of its branch components, sending them commands and queries initiated by an external management system. BRCU 32 also serves during the setup and commissioning of the ESLS as a means for learning the identities (IDs) of the installed branch components, for locating them during the mapping process (described below), and for configuring them. Line coupler 72 is a galvanic isolated element that includes a PLC line coupler 504 and a PLC transceiver interface 508 described below with reference to FIG. 7. Coupler 72 allows the connection of the different BRCUs to their branches, decoupling the signals and the noise existing on the branches from each other, while allowing the connection of the branches to the high voltage. Back-filter 38 isolates the PLC communication signals within all other branches from the intra-branch communication signal within a particular branch. It also isolates a branch from outside world conducted incoming pollution, which may affect the communication performance by reducing the S/N (Signal to Noise Ratio). Ballast 50 may be any single and multi-fixture electronic ballast described herein, e.g. a MCB, a MFEB, a MFDEB, or any other EB. In a particular case, there are applications in which the ballast will have only receivers and single discharge lamps with integral ballast. In general, the system can also comprise other lighting components using LEDs or other types of lamps, provided that the ballast or the power supplies driving them comply with the specifications required by the ESLS The system shown in FIG. 1 manages and controls components that are connected to power line branches 44 of a power distribution panel 34, branches 44 being connected to the electrical power distribution network via circuit breakers 36 by means of back filters 38. Each of the branches has one phase 40 or two or three phases and a "neutral" 42. A power line branch 44 is the medium of the communication transmission, to which are connected the controlled and the controlling components of the branch.

The embodiment in FIG. 1 shows a control system using PLC communication and optional interoperating capability, in which the PLC communication is implemented in power line branches 44 only. According to the present invention, the control of the branch components within the branch is autonomous, and independent of any central control/s outside the communication medium of the branch. As a result, the PLC communication operates in a protected environment, and the PLC traffic is entirely contained within the branches, and controlling separately a low number of components per branch. Therefore, the control traffic level is low, because the number of components is small. Moreover, the control traffic has a high signal to noise (S/N), and the protocol and the reaction time as well are short. In a larger system comprising a larger number of branches, working independently in parallel, the traffic per branch does not increase and therefore there is no performance degradation of the control. The minimal configuration of an ESLS 30 comprises one BRCU 32, a line coupler 72, a back-filter 38, a power line branch 44, and the specific branch components, the system being in this case an independent branch control subsystem. In such a "single branch" system, the control of the components connected to the branch is being carried out independently. In addition, within the larger system 30 of FIG. 1, there can therefore be a number of such single branch systems, each having its own BRCU. In the configuration of FIG. 1, the control in each branch is autonomous, but each branch can also receive commands or queries from other branch control subsystems via its BRCU 32. Furthermore, each branch may receive commands or queries from other management systems via its BRCU 32 and through CRCU 60. Conversely, each branch control system may send commands, status, or queries to other branches or management systems, as well as provide information related to queries. A more detailed explanation of this communication mechanism is given below. As a general embodiment, the ESLS can be conceived as controlling and managing a wide area of a building, e.g. an entire floor or part of it, involving all the control system components connected to the branches of a single power distribution panel. Each of the power distribution panels is interoperating with a high level building control system through a wired standard bus, using preferably the DSSS communication method described below, or an Echelon, Bacnet, or other standard communication buses. In a particular embodiment, the ESLS can have a common BRCU dedicated to several branches of one single phase that have a low number of components, and the back filter is connected at the entrance of the electrical power bus, common to all the circuit breakers of these branches.

Alternatively, for stand-alone inter-branch communication, the BRCU can be omitted as an active part of the control (this depends on the protocol that is used). However and typically, in many installations there is a need to pass commands over the branch boundaries (e.g. in a case that a "Lighting Zone" has components in more than one branch). The passing of commands over branch boundaries is done through a fast communication bus 68, preferably a RS485 bus, which links the BRCUs. BRCU 32 is also used to assist passing commands and queries from a BMS bus 66 via a communication port 62 of CRCU 60, or vice versa, transferring status to the BMS from the ESLS. In the general case, CRCU 60 is connected and interposed between the BRCUs and the BMS bus. The communication of the CRCU with the BRCUs and the EMS bus is through communication ports 64 and subsequently via communication bus 68. The CRCU does not have a PLC, but it has more computing power.

LCU 54 commands a corresponding EB for dimming, power-On, and power-Off, according to the addresses that are inscribed in its memory as belonging to its zone, individually, or per group or single lamp in a fixture. The same zone or part thereof can be commanded by another LCU. The LCU commands can be manual or automatic, by closing a loop with the occupancy sensor, lighting sensor, or other sensors that are typically connected directly to the LCU, or by transmitting their status to the LCU from a sensor concentrator 56. LCU 54 can be a wall control unit, or located remotely on the ceiling. Commands can be manual by push buttons, remote-controlled by hand held IR or RF, or by using other remote communication means.

Ballast 50 and LCU 54 can be combined into one "branch component", in which case the PLC transceiver of the ballast can also be used for transmitting and receiving the PLC signal of the LCU functions. In addition, considering that the ballast is typically installed in the ceiling, close to sensors, the sensors that are commonly connected to the LCUs can be connected directly to this type of ballast, saving wiring costs. In this case, the commands initiated by persons can be performed by wireless means such as RF handheld devices. The system can serve other sensors that are not related to lighting, such as temperature, humidity, $CO_2$, sensors related to HVAC or environment, fire detection, security sensors, etc. In this case, the LCU can also set the temperature and turn Off and On the air conditioner, the fan, etc., and/or serve as a local control of the other systems mentioned. The LCU can be programmed to send, automatically or by query, the relevant information gathered by each type of sensor via the BRCU to another branch, or to another management system through BMS bus 66. LCU 54 can be used also to set the thresholds of the parameters of the sensors, and send the respective information when out of range to another branch or another management system, for warning or for closing the loop.

Sensor concentrator 56 is a device that includes all LCU functions except the command functions. In addition, it transfers the sensors information to the corresponding LCUs. Actuator 58 is a device that receives information or commands and activates an element. The activated element can belong to a building automation system, an HVAC, etc. The commands can be from within the branch, initiated by an LCU 54 or by a status signal sent by sensor concentrator 56, or from outside the branch. Actuator 58 can provide status feedback automatically or by query. Repeater 70 is a device that allows to increase the communication distance within the branch by retransmitting an entire message or part of it, or by adding information to the basic message. In addition to the described above, one can combine the functions of two or more branch components within one device.

CRCU 60 serves as an interface gate that facilitates the interoperability between other management systems and the branch network. The interoperability is implemented over another management system bus (BMS bus 66) via CRCU communication port 62. The CRCU receives the command or query sent by the other management system, and retransmits it to the respective component(s) connected to the branch(es) via their respective BRCUs. The communication to the BRCUs is effected by fast communication bus 68 via another CRCU serial port 64. The CRCU transmits back to the other management system the information received from the components of the branches, or it answers to the query or information initiated by these components. It can function as a central controller of the branch network, and may initiate its own commands and queries. Furthermore, it can serve for setting (including groups of addresses, thresholds etc.) of the components connected to the branches. The CRCU has all the command capability of an LCU, and can reach any group or individual components of any branch.

To remove all doubt, we note that all controllers described in the present invention, including LCUs, BRCUs and CRCUs are preferably implemented with an IDC 1700 as described with reference to FIG. 17 below, and in more detail in U.S. Patent Application No. 60/384,410. Alternatively, one or more of these controllers may be implemented by other controllers having the required interfaces, and analog and digital inputs/outputs. The present invention also envisions a possible application of systems that include a mix of IDCs and other types of appropriate controllers Branch Remote Control Unit (BRCU)

Some of the tasks and capabilities of a BRCU were discussed above. In addition, a BRCU is defined as a device capable of managing the PLC traffic over a branch power line. Besides managing the traffic over a branch, several BRCUs are capable to form a network that can control the PLC traffic over several branches. For example, a full lighting network can be viewed as a group of branches, with different elements (ballasts 50, LCU 54, sensor concentrators 56, actuators 58, repeaters 70, etc.) connected to each branch. A minimal structure of a BRCU is depicted in FIG. 2

Figure 2:
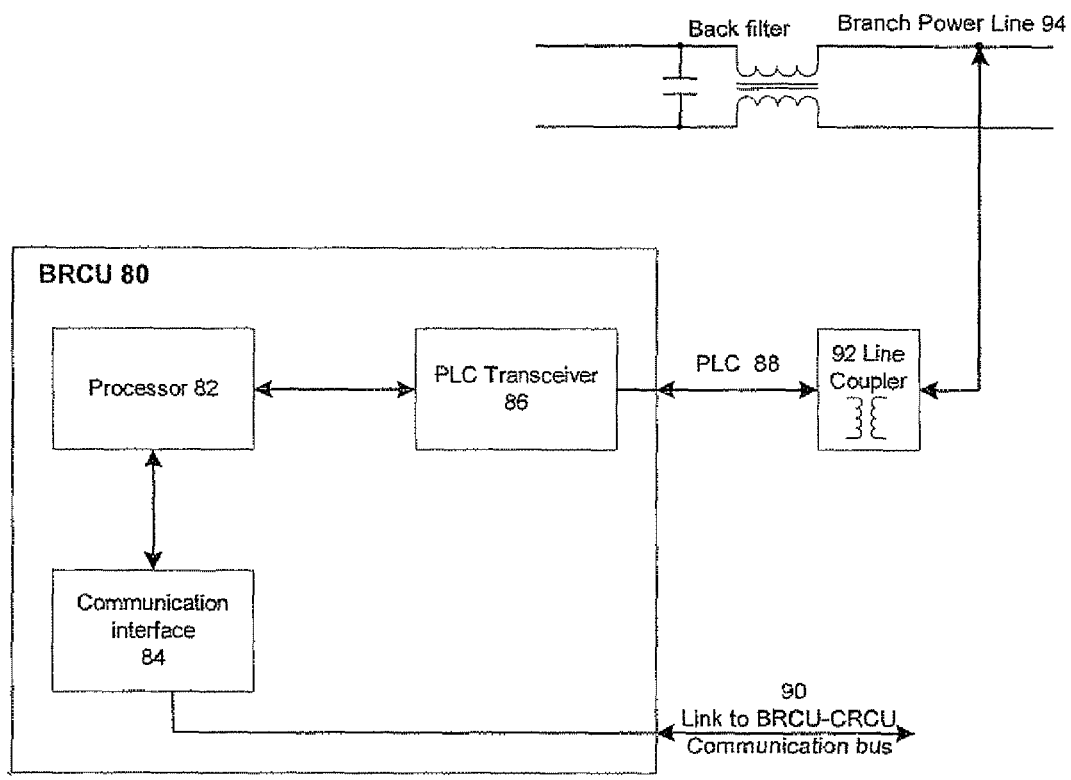
FIG. 2 shows a minimal structure of a BRCU.

In FIG. 2, a BRCU 80 preferably comprises three elements: a processor 82, preferably a CPU block 1702 (FIG. 17), a fast communication interface 84, preferably using a SPI/UART 1710 (FIG. 17) with RS 485 interface, and a PLC transceiver 86, preferably a DSSS modem (PLC communication module 1706 (FIG. 17), all described below. The PLC transceiver is used to communicate with the elements connected to branch power line 94 (branch power line 44 of ESLS 30 in FIG. 1) via a PLC I/O 88, (preferably implemented by PLC inputs 1712 and PLC outputs 1714 of an IDC 1700 described below with regard to FIG. 17), by means of a line coupler 92 (FIG. 2), same as line coupler 72 in FIG. 1. Fast communication interface 84 is used to communicate with other BRCUs or with CRCU 60 (FIG. 1) through a BRCUs-CRCU communication link 90 (FIG. 2), preferably an IDC serial communication port 1718 (FIG. 17). Processor 82 is used to coordinate and interpret the traffic of commands and data.

The role of BRCU 80, in addition to arbitrating the PLC communication signal transmitted within the branch, is to function as a stand-alone manager for each branch, and to pass messages from the branch to other branch(es) via the link to BRCU-CRCU communication bus 90. In case a branch has two or three phases, and the elements in the branch are single phase loads and connected to different phases, each phase is managed by a separate BRCU. In that case, the transmission messages of each of these BRCUs are synchronized in such a way that transmission in one phase will not overlap the transmission in the other phases. This will prevent that PLC signals being transmitted in each phase from colliding or disturbing the control signals transmitted in the other phases, due to the loads connected to the common neutral. In case the loads are of two or three phases respectively, then only one BRCU will manage this branch and will be connected to one phase only, and the PLC transceiver of each of the elements will be connected to this phase.

In case the ESLS at the level of a power distribution panel is reduced to one branch or various branches of the same phase with one dedicated BRCU, the BRCU and the CRCU are merged into one element called remote control unit (RCU). An RCU 662, described in reference to FIG. 8b below, has all the combined and relevant functions of the BRCU and the CRCU, and is preferably implemented in one single IDC 1700 component.

In the preferred embodiment, the BRCU stores status information of the relevant branch components. The BRCU listens to the messages transmitted in the branch and to the messages transmitted in the fast communication bus 68 (FIG. 1) between the CRCU and the BRCUs. Thus, a BRCU can operate as a gate to the PLC network.

Physical System Mapping and Configuration

One of the difficult tasks when commissioning a system relates to the correlation between the physical placement of the different system components and their absolute ID, formatted preferably into 32 bits in the IDC ($10^9$ different numbers). Once this correspondence is established and stored in a central computer, or in a BRCU, a CRCU or a RCU, the information is available for further processing. Thereafter each element is allocated a local ID related to its position in the network, the zone and/or the scenes/groups to which it belongs, etc. The main difficulty is in performing the basic correspondence between the physical placement of the elements and their absolute ID. One solution is to print on each element its absolute ID and read it by a bar code reader, or alternatively to glue to the device a commercial RF ID device. This is a manual procedure. The information is either stored in a local media held by the worker, or transmitted in real time to the central computer, BRCU, CRCU or RCU.

In the present invention, in a first preferred embodiment of an automatic method for correlating between the physical location of a component and its ID, preferably supported by the IDC, each CRCU and each BRCU have their specific addresses. So does each branch component within the branch. In addition, as mentioned, each IDC has its absolute ID of 32 bits ($10^9$ absolute addresses). The method consists of a cascading sequence. First the central computer addresses the CRCUs by scanning all the addresses from zero to $2^{10}$ (1024). Each CRCU that responds is allocated in the computer a local ID that is numbered sequentially. The same procedure is repeated by each CRCU with regard to the BRCUs that it commands. Similarly, for a branch system, each BRCU repeats the process for all the devices (components) within its branch. Assume that a branch includes up to 256 branch components, a CRCU is communicating with up to 256 branches, and a central computer is communicating with up to 256 CRCUs. The choice of 8 bits (256 elements) is exemplary only, and any other number of bits can be allocated at each system level. This is followed by superposing the addresses of the CRCU (preferably 8 bits) or the BRCU preferably 8 bits) and the device (preferably 8 bits), into one word of 24 bits that provides an absolute address to each device in a system by a hierarchical method. At this point we have a one-to-one correspondence between the absolute ID and the local ID.

In the automatic procedure, each interrogating element (central computer, CRCU or BRCU) sequentially interrogates each component controlled by it. Whenever an element responds, it is inscribed in memory indicating its existence. This interrogation is done using preferably the last 11 bits of the absolute ID. In case there is a collision because more than one component responds to the same interrogation, the interrogating element increases by 1, 2 or 3 bits, until collision is avoided.

The allocation of the physical location to the local ID is performed by instructing the BRCU (in the case of a branch) to light the lights one at a time. Once the light is on, the operator records the coordinates of the physical location that is stored in the BRCU. The allocation of physical addresses to elements other than ballast, will be done using LEDs instead of lights, or other signaling means such as RF.

In another embodiment of the automatic method for correlating between the physical location of a component and its ID, each device has an absolute ID number defined by 32 bits. Scanning the corresponding net to get those physical addresses will be too long, therefore it is proposed to get the absolute ID by using a variant of the anti-collision protocol described below. The protocol is defined as follows: the network manager (CRCU for example scanning BRCUs, or a BRCU scanning its PLC net) issues an ID interrogation command. Every member of the network allocates a random priority to itself. Then, each member of the network transmits its ID number with a time delay that corresponds to its priority. Most of the back transmission messages will be recognized by the network manager (CRCU or BRCU), but there will be some collisions. The data of the colliding transmissions will be discarded using an error detection method. Thereafter, the manager will send all acknowledge to the elements whose IDs were successfully received, and these elements will be excluded in the next interrogation round. Subsequently, the manager will send a second interrogation command and so on until all IDs are recognized. Following this process, the network manager can allocate local IDs for fast access to the network elements. The correspondence between the physical location of the different elements and their local IDs is performed as described in the above method.

Multi-Channel Ballast

Figure 3A:
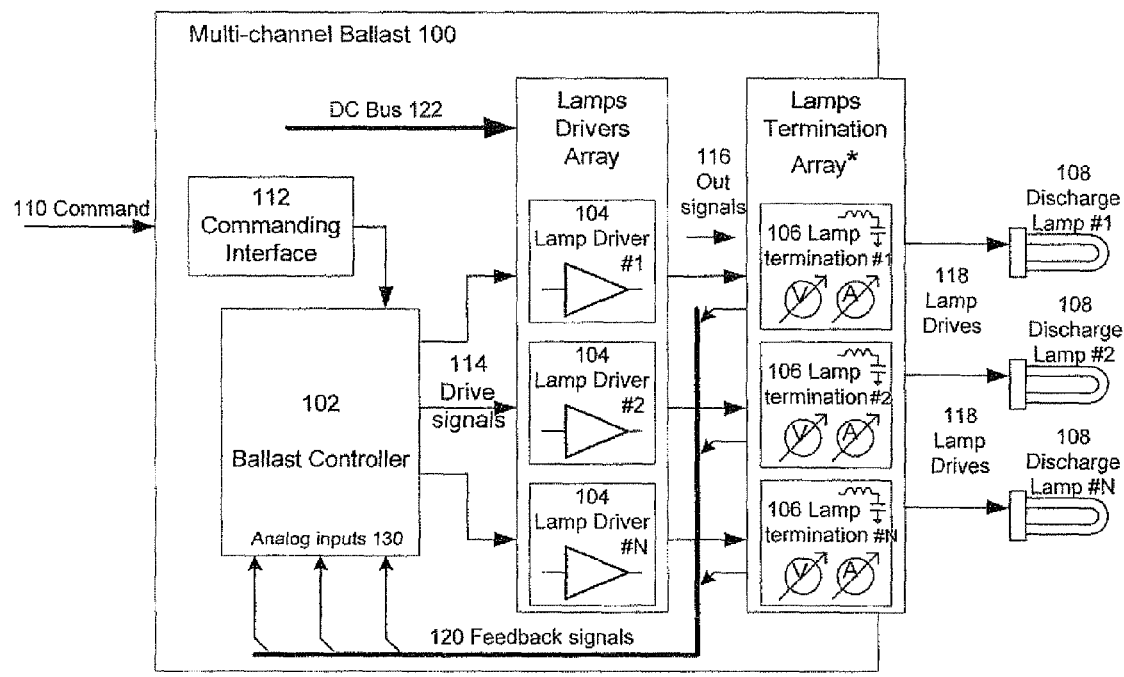
FIG. 3a shows a preferred embodiment of a multi-channel ballast (MCB) according to the present invention.
Figure 3B:
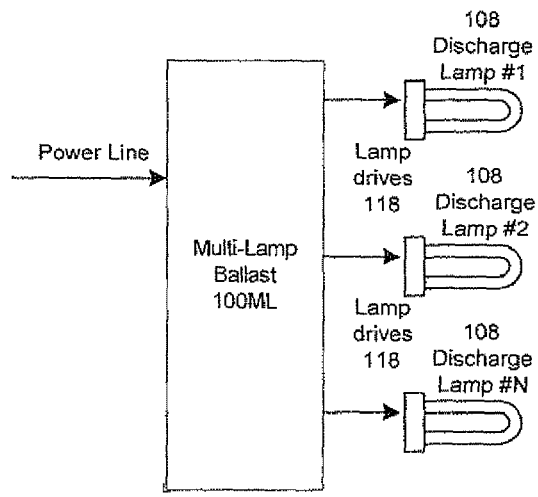
FIG. 3b shows a multi-lamp ballast embodiment of the MCB of the present invention.

The following describes an MCB, shown in FIG. 3a. Further, the MCB can be divided into two families: a multi-lamp ballast (MLB) depicted in FIG. 3b and a multi-fixture ballast (MFB) depicted in FIG. 3c.

FIG. 3a shows an MCB 100 that comprises a central ballast controller 102, connected through a lamp drivers array 104 having a plurality of lamps N and through a lamp termination array 106 with a plurality of lamp terminations N identical with that of driver array 104, to a multiplicity of discharge lamps 108. Ballast 100 provides a controlled power to discharge lamps 108. Each lamp 108 is controlled separately. Each lamp termination includes a passive network, typically a resonance circuit to ignite and operate each discharge lamp, and sampling circuits to measure voltages, discharge currents, or both, in each lamp. The lamp termination also includes passive components to provide the lamp voltage, the lamp discharge current, and the lamp filament voltage. Typically, there is a serial resonance circuit with the lamp in parallel to a capacitor, and the filaments provided from auxiliary windings of the resonance inductor via capacitors, see description of FIGS. 9b and 9c below. Other passive circuits can also be used.

Multi-channel ballast 100 is powered by a DC Bus 122 that can be produced in ballast 100 by a power factor correction (PFC) stage or by another power stage that regulates a DC Bus, or provided by an external source (not shown). External commands 110 ("On", "Off", "Up", "Down", "Discrete Light Level", "Acknowledge", etc) are provided to ballast controller 102 via a commanding communication interface 112. All communication interfaces of the ballast are optional, and, in a "stripped-down" embodiment, the ballast may operate independently of external commands. Ballast controller 102 is preferably an integrated circuit, and most preferably and advantageously an IDC. In contrast with prior art ballast controllers, controller 102 integrates the control of the ballast, and can provide one control for all discharge lamps 108, or separate control for each discharge lamp. The IDC mentioned above is the preferred controller in all system embodiments mentioned below. Controller 102 provides control drive signals 114 to lamp driver amplifiers in each driver (not shown).

Drivers 104 may be of any known power topology used in the industry. For example, they may be a half bridge, a full bridge, or a push-pull power topology. Output signals 116 from lamp drivers 104 are delivered to each lamp termination 106. In the case of a single ballast driving an external multiplicity of lamps, the lamp termination array is part of the ballast. In the case of the ballast operating remote "light fixtures", each lamp (or lamps connected in series) is connected to its own lamp termination 106 located in the light fixture.

Analog feedback signals 120 are sampled in each lamp termination 106 unit, and provided each to analog inputs 130 of ballast controller 102. The ballast controller processes feedback signals 120 according to its configuration and according to the commands. The outputs of this process are controlled drive signals 114. Each and every lamp 108 of a ballast or light fixture can be addressed individually by command 110 for shutdown or turn on and or change the light level. The ballast can also be asked to acknowledge commands and report status and parameters of the lamp's current, voltage, light level, number of ignitions, working time, etc.).

In order to command and control a multiplicity of discharge lamps connected in parallel, a separate lamp driver must be used for every channel (each channel operates one discharge lamp or a few lamps connected in series). Although as mentioned any power topology may be used with the multi-channel ballast, the present invention provides a preferred power topology—an economical half bridge—to be used in this case.

Figure 4A:
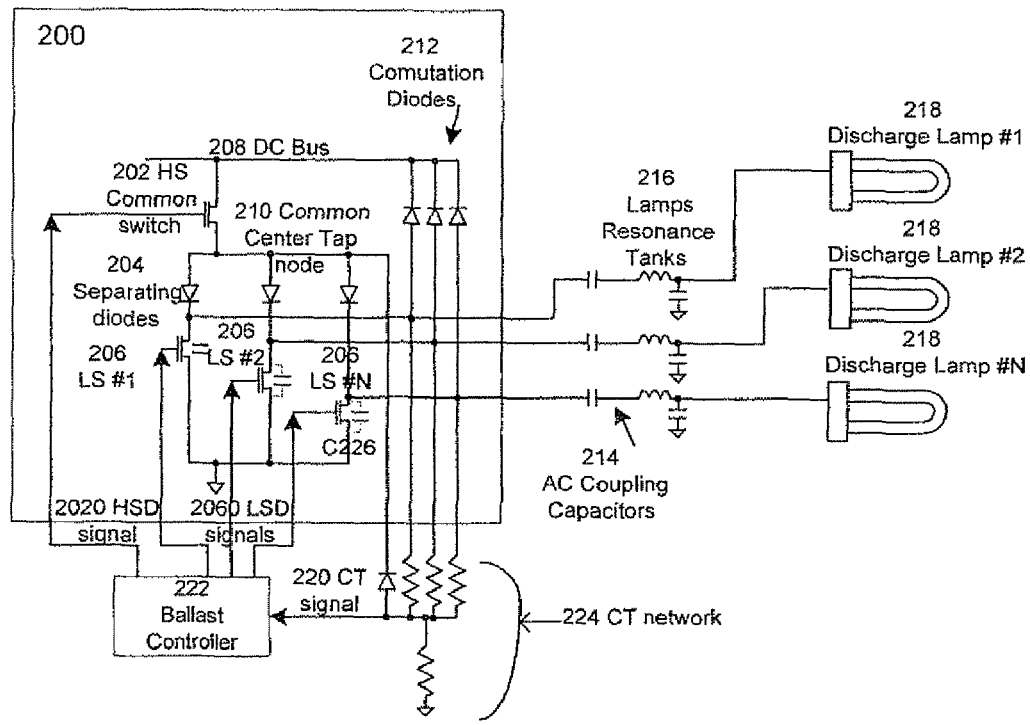
FIG. 4a shows an economical half bridge topology for N channels, which uses a common High Side switch and a multiplicity of Low Side switches.

FIG. 4*a* shows an economical half bridge 200 topology for N channels, which uses a common high side (HS) switch HS 202 and a multiplicity of low side (LS) switches LS 206, one LS switch for every channel. Alternatively, and within the scope of this invention, half bridge 200 may use a common LS switch and a multiplicity of HS switches, one HS switch for every channel. The economical half bridge topology is an improvement on, and derived from the well known half bridge topology, and works very much like it. The benefits of a common HS switch half bridge topology versus the common half bridge are mainly: 1) reduction in cost as a result of reduction in the number of required switches (one instead of N channels); 2) reduction in switch driver components (not shown); and 3) reduction in the number of drive signals 114 of the ballast controller, or a more efficient use of the existing drive outputs outputting signals 114. Half bridge 200 preferably uses power MOSFETs as HS and LS switches, hence, each switch has a parasitic diode connected in parallel with the switch in the opposite direction to the conduction direction of the switch. However, although MOSFETs are preferable for all switches, other types of switches such as bipolar transistors (BJTs), insulated gate bipolar transistors (IGBTs), etc may be used for switches in all embodiments. For most applications, when using switches other than MOSFETS, a parallel diode should be connected across the switch in the opposite conduction direction of the switch.

Figure 4B:
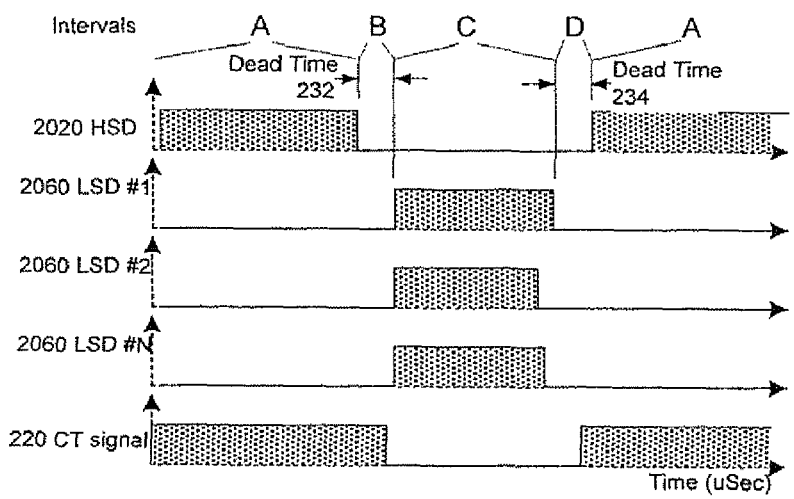

In FIG. 4*a*, a ballast controller 222 operates according to the sequence described in timing diagram 230 shown in FIG. 4*b*:

Interval A. The ballast controller provides a HS drive HSD 2020 a "1" pulse to switch-on common switch HS 202. All LS switches are kept Off. Current flows from a DC bus 208 via HS 202 and via separating diodes 204 to each of a plurality of lamp resonance tanks 216. The pulse width of HSD 2020 can be a fixed or can be a controllable parameter.

Interval B. Ballast controller 222 provides HSD 2020 a "0" pulse to switch-off common switch HS 202. All (LS and HS) switches are Off for a "dead time" 232 interval to allow discharging of the parasitic capacitance 226 of each LS 206 switch to zero voltage, and to render conductive the parasitic diodes in parallel with conducting LS switches 206. The dead time interval can be a fixed parameter or it can be a function of a CT network 224 further described below, which samples a common center tap 210 voltage to create a CT 220 signal. CT 220 becomes "0" only when all LS 206 parasitic parallel capacitances 226 are discharged.

Interval C. At the end of the dead time 232 interval, all active LS 206 switches are turned On by an active LS drive LSD 2060 of controller 222 becoming "1" (one or more channels can be kept Off by not activating their LSD 2060 signals). The interval in which each LS 206 switch conducts is controlled separately according to the feedback signal of the lamp (see 120 in FIG. 3*a*), thus each of the LSD 2060 pulses may be of different width, as seen in the diagram.

Interval D. This interval is a "dead time" 234 that begins after the last LSD went Off ("0"). The interval "dead time" 234 can be a fixed parameter, or it can be a function of the further described CT 220 signal. This signal is provided by CT network 224, which detects that all LS 206 switches went Off, and that each of their parallel parasitic capacitance 226 was charged to the DC bus 208 voltage (clamped by commutation diodes 212). The end dead time interval 234 coincides with the start of a new period with the HS 202 switch turned On. The topology enables to turn discharge lamps 218 (same as lamps 108 in FIG. 3*a*) On and Off separately, by enabling high frequency toggling of the corresponding LSD 2060 outputs of ballast controller 222. When enabled, each of the LSD) 2060 outputs of the ballast can be controlled for best preheat, ignition, and operation of discharge lamps 218 (including regulating and dimming their light). A lighting channel is disabled by disabling the correspondent LSD 2060 output.

Figure 5:
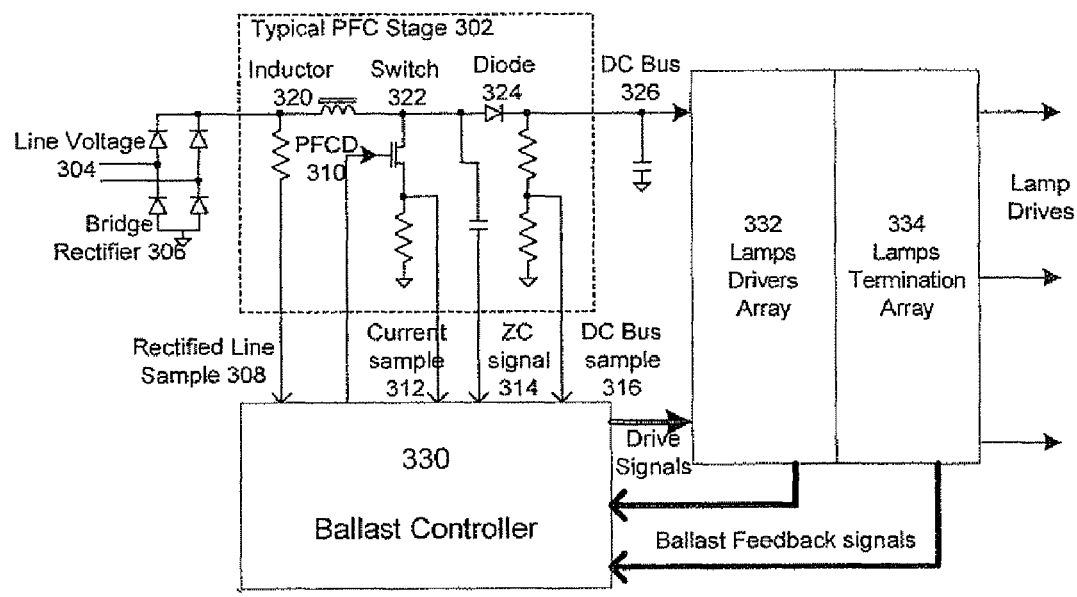
FIG. 5 shows an embodiment of a multichannel ballast that optionally includes a power factor correction (PFC) stage.

FIG. 5 shows an embodiment 300 in which a multi-channel ballast optionally includes a PFC stage. A ballast controller 330, preferably an TDC, has a multiplicity of analog and digital inputs, a multiplicity of control channels, and a multiplicity of drive outputs. In this embodiment, some of these resources are used to provide inputs, to control, and to receive outputs from a lamp drivers array 332 and a lamp termination array 334. One output PFCD 310 is used to drive a Power Factor Correction (PFC) switch 322 of a PFC stage 302, and four input signals are used for the PFC circuit feedback signals. These signals are: a rectified line sample 308 signal used mainly for high power Continuous Mode applications; a current sample 312 signal used for current limit protection and for control; a zero current ZC signal 314 used mainly for Critical Mode applications, and a DC bus sample signal 316 used to regulate a DC bus 326 voltage.

A line voltage 304 is rectified by a bridge 306 (mostly a single phase bridge rectifier). The rectified waveform is fed to the PFC stage. The PFC stage is implemented preferably with a Boost regulator topology, and includes a PFC inductor 320, a PFC switch 322 and a PFC diode 324. The output of the PFC stage is the DC Bus 326.

For Critical Mode and Discontinuous mode applications, the PFC preferably uses an algorithm described in U.S. Pat. No. 6,043,633, which is incorporated herein by reference. However, the PFC may use other dedicated algorithms. For Continuous Mode applications, the PFC stage can use one of many known algorithms. If the controller is an IDC, it can be configured and reconfigured to provide the required algorithm to the PFC stage as well as to the lamps drivers stage.

Figure 6:
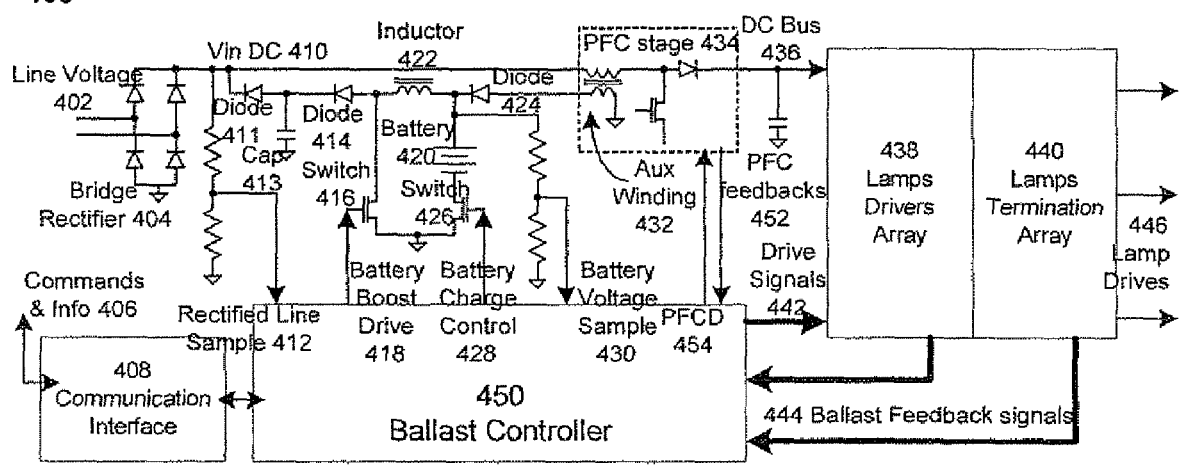
FIG. 6 shows an embodiment of a multi-channel ballast that optionally includes an emergency lighting circuitry with battery management in addition to a PFC stage.

FIG. 6 shows an embodiment 400 in which a multi-channel ballast includes optionally a PFC stage 434, and further includes optionally an emergency lighting circuitry with battery management. A ballast controller 450, preferably an IDC, includes a variety of multi-purpose resources including analog and digital inputs, drive outputs, a multiplicity of calculating and processing channels and more, all configurable for independent or mutually dependent control applications. The resources of the ballast controller are used for four different control tasks:

1. Commanding and controlling a multiplicity of discharge lamps using drive signals 442 to a lamp drivers array 438, and closing the control loops by ballast feedback signals 444 from array 438 and from a lamp's termination array 440 that provides lamp drives 446 to the discharge lamps.

2. Controlling a PFC stage 434 to condition the current of a line with a line voltage 402, and to provide a regulated DC Bus 436 to lamp drivers array 438. Ballast controller 450, which gets PFC feedback signals 452 and provides a PFCD 454 pulse to a PFC stage 434 switch, performs the PFC stage control.

3. Managing battery 420 charge and discharge algorithms. The example 400 depicted in the embodiment of FIG. 6 suggests charging of the battery from an auxiliary (Aux) winding 432 of the PFC inductor (320 in FIG. 5) of PFC stage 434. The Aux winding can be used in Flyback Mode, Forward Mode, or preferably in a combination mode. A diode 424 represents the rectification scheme of the energy coming from Aux winding 432. The battery charging is controlled by a battery control switch 426 driven by a battery charge control 428. The loop is closed on a battery voltage sample 430. Example 400 is just one of many ways to manage a battery. The innovative aspect is in the capability of ballast controller 450 to be configured flexibly for any known or new solution.

4. In the case of using a low voltage battery (relative to line voltage 402) the solution depicted above suggests stepping up the voltage of battery 420 to an intermediate DC voltage value across a capacitor 413, and separating a diode 411 to a voltage Vin DC 410 (when line voltage 402 is absent). The stepping up of the battery voltage in this example is carried out using a boost topology circuit combined of an inductor 422, a diode 414 and a switch 416 that controls Vin DC 410 voltage. The boost process uses drive 418 from ballast controller 450 and closes the loop on the rectified line sample 412. Sample 412 is also used to detect the line voltage 402 presence.

In normal operation, the ballast operates from line 402, and battery 420 is kept charged. When the line voltage disappears, the battery takes over by creating an intermediate DC voltage across Vin DC 410, instead of the absent rectified line voltage. The PFC stage is converting this voltage to DC Bus 436, which is continuously supplied to the lamps drivers.

The flexibility of the multi-channel ballast enables to decide which of the lighting channels will be active, and what will be the light level. By monitoring the battery 420 voltage using battery voltage sample 430, the back-up time can be predicted and reported (info 406) to a control center via an optional bi-directional communication interface 408. Switch-Off can be decided internally in ballast controller 450 by a predetermined parameter, or remotely (commands 406) via communication interface 408, which can also command reducing the number of activated lamps and their light level.

Figure 7:
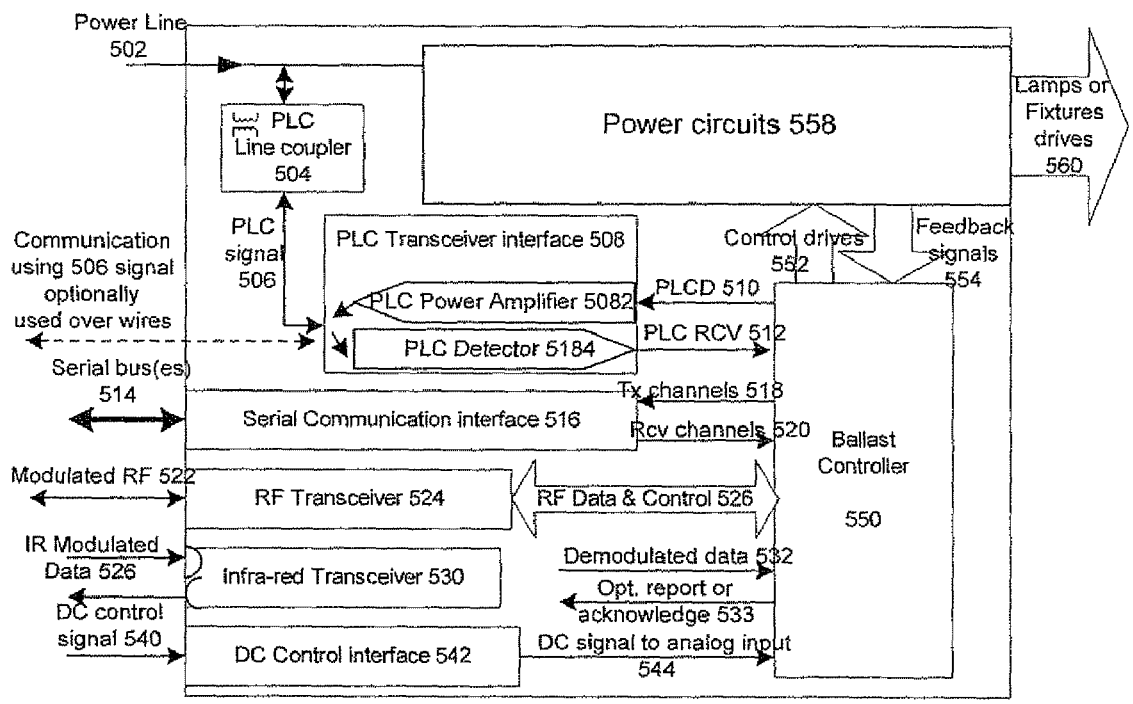
FIG. 7 shows a multi-channel ballast with communication options.

FIG. 7 shows a multi-channel ballast 500 with communication options. As mentioned, in general, all communication interfaces of the ballast are optional. When existing, the communication may occur by one or more of the following:

1. PLC Communication: A ballast controller 550, preferably an IDC, optionally has a built-in PLC transceiver that can be configured to operate according to a desired protocol, as described in detail herein. The PLC communication can be unidirectional or bi-directional. The PLC communication can be used for remotely commanding the ballast and each of its lamps and/or light fixtures. The PLC can also be used for remote configuration of the ballast. When bi-directional communication is used, the ballast can acknowledge commands and can report the status including lamp current and voltage measurements, which are obtained as feedback signals 554 from power circuits 558. A ballast with bi-directional PLC communication that can be commanded by IR or RF, can pass the commands further to other ballasts that reside on the same line. In FIG. 7, a PLC signal 506 is coupled to a power line 502 via a PLC coupler 504. A PLC interface 508 includes a PLC signal detector 5184 that detects the signal from PLC signal 506, and delivers a PLC RCV (received signal) 512 to the ballast controller, where it is processed, and the commands carried out. PLC interface 508 also includes a power amplifier 5082 that receives PLCD (PLC transmit drive) 510 a signal from ballast controller 550, amplifies it, and delivers it to power line 502 via PLC coupler 504. Signal 506 can be optionally used over a two-wire communication medium.

2. Serial Communication: Ballast controller 550 has optionally built-in one or more UARTs (Universal Asynchronous Receiver Transmitter), and for every UART it has one Tx (transmitting) output 518 and one Rcv (receiving) input 520. A serial communication interface 516 receives Tx 518 from controller 550, adapts it to the specific standard, be it RS232, RS485, Microlan or other, and transmits it to a serial bus 514. Optionally, interface 516 uses an opto-coupler (not shown) or transformer (not shown) for isolation of the transmitted signal. Interface 516 receives signals from serial bus 514, optionally couples them via the opto-coupler or transformer, and adapts the signal to the Rev 520 input of ballast controller 550. The serial communication is always used for the configuration of ballast controller 550. It can also be used for remote commanding the ballast and for the ballast to acknowledge commands and report statuses using a protocol such as DALI, or others.

3. RF Communication: Ballast controller 550 has optionally a built-in algorithm that can control an RF Transceiver 524 to transmit and receive (by using an antenna) RF modulated data 522 (commands, acknowledge, etc.), and to send detected RF data and control 526 to the ballast controller, where it is processed and carried out.

4. Infra-red communication: FIG. 7 further shows optional IR modulated data detected by an IR transceiver 530 and sent as demodulated data 532 to the digital inputs of ballast controller 550. Bi-directional communication can be used optionally with information from controller 550 sent as report or acknowledge data 533 to IR transceiver 530, where it is IR modulated and transmitted out as IR modulated data 526.

5. DC control: FIG. 7 further shows an optional DC Control signal 540 entering an appropriate DC control interface 542 that adapts the input signal (and optionally isolates it using an opto-coupler or transformer) and sends it out as a DC signal to an analog input 544 of the ballast controller.

Figure 8A:
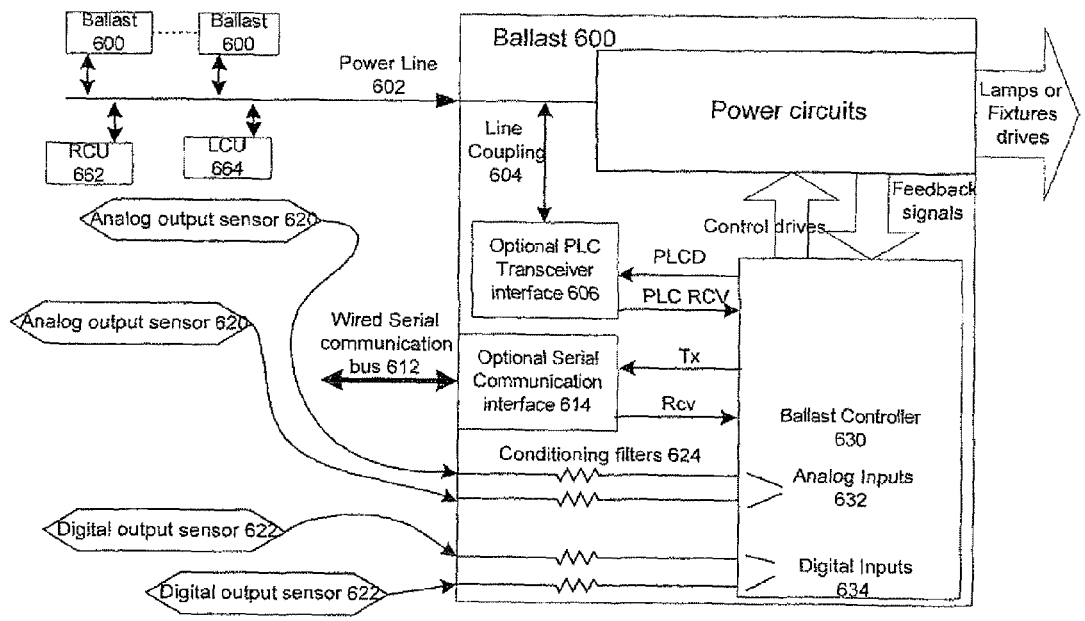
FIG. 8b shows schematically the spread out architecture in which a communication medium connects a plurality of distributed ballasts to collect information from spread sensors.

FIG. 8a shows a multi-channel ballast 600 connected optionally to a number of different types of sensors, such as analog output sensors 620 and digital output sensors 622. As already mentioned, a ballast controller 630 includes a multiplicity of analog inputs (here inputs 632) and digital inputs (here inputs 634). These resources can be used to collect information from sensors located typically on the ceiling, and connected typically to the power line for their supply. The information collected from the sensors can be processed in ballast 600. Using the communication capabilities of the ballast controller 630 (identical with the controller mentioned in previous embodiments), and the communication circuitry in ballast 600, e.g. an optional PLC transceiver interface 606 and an optional serial communication interface 614, the processed information can be sent to other ballasts 600 and to remote control units RCU 662, and LCU 664. RCU stands for all types of remote control units including Branch controllers (BRCU), and central controllers (CRCU) as the one in FIG. 6a, while LCU stands for "Local Control Unit", a unit that resides on the same communication medium, e.g. a power line 602 or a wired serial communication bus 612. At least one of the many communication options must be used to provide information gathered by digital output sensors 620 and 622 to entities that are outside ballast 600, and connected to it using the same communication medium, be it PLC communication or any kind of two-wire communication or RF communication (not shown). Optionally, using PLC communication, all ballasts 600 and all types of remote controls on the same power line 602, e.g. 662 or 664, have access to the information transmitted by ballast 600. The idea is that sensors 620, 622 will be connected directly (only conditioned and filtered through conditioning filters 624) to analog inputs 632 and digital inputs 634 of the ballast located nearest to the sensors. As depicted in FIG. 8a, the connection of sensors to a ballast can be realized using a wired serial communication bus 612. Other types of communication can also be used over the same wires. Using this "spread out" architecture, ballasts co-located with sensors of the same area share the information with the other ballasts, remote controls, and data centers that are connected to them. Optionally, any type of wired communication can be used for the same function as described above for the PLC communication.

Figure 8B:
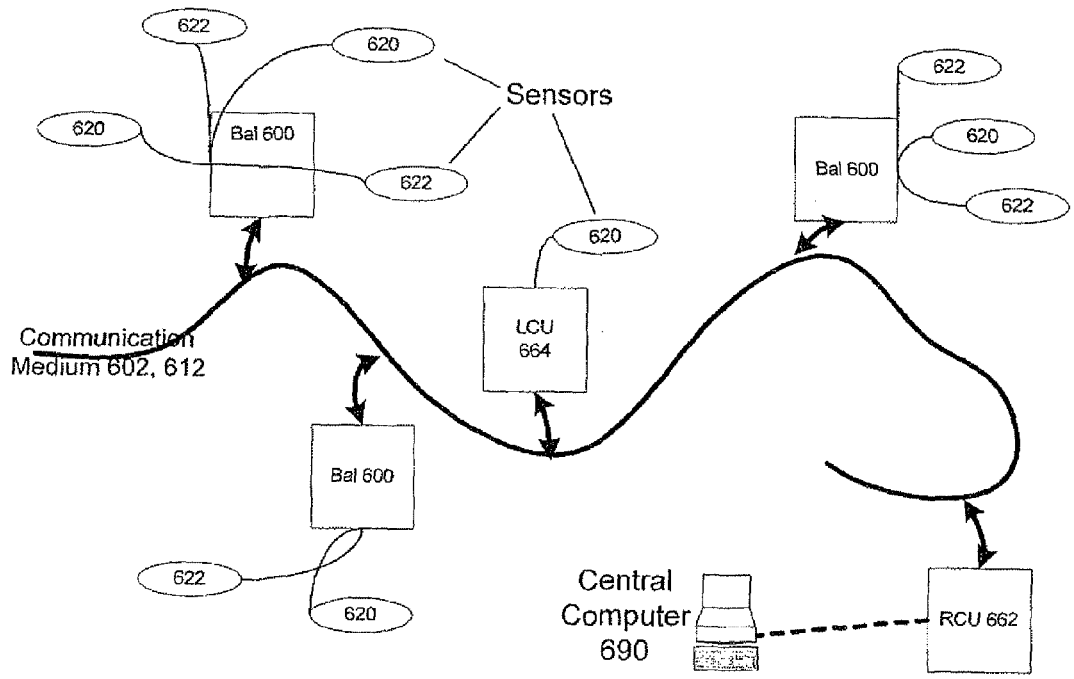

FIG. 8b shows schematically the spread out architecture in which a communication medium such as power line 602 (see FIG. 8a) connects a plurality of distributed ballasts 600. The whole system may be connected to an external central computer 690 that communicates with medium 602 and ballasts 600 through RCU 662. The innovative aspect here is the method of collecting information from the sensor(s) to a ballast located adjacent to the sensor(s), and using the same communication medium that the ballast uses in order to transfer sensor data to remotely located ballasts and controls such as RCU 662, and to central information stations such as central computer 690. This is only one illustration of the many possibilities afforded.

Figure 9A:
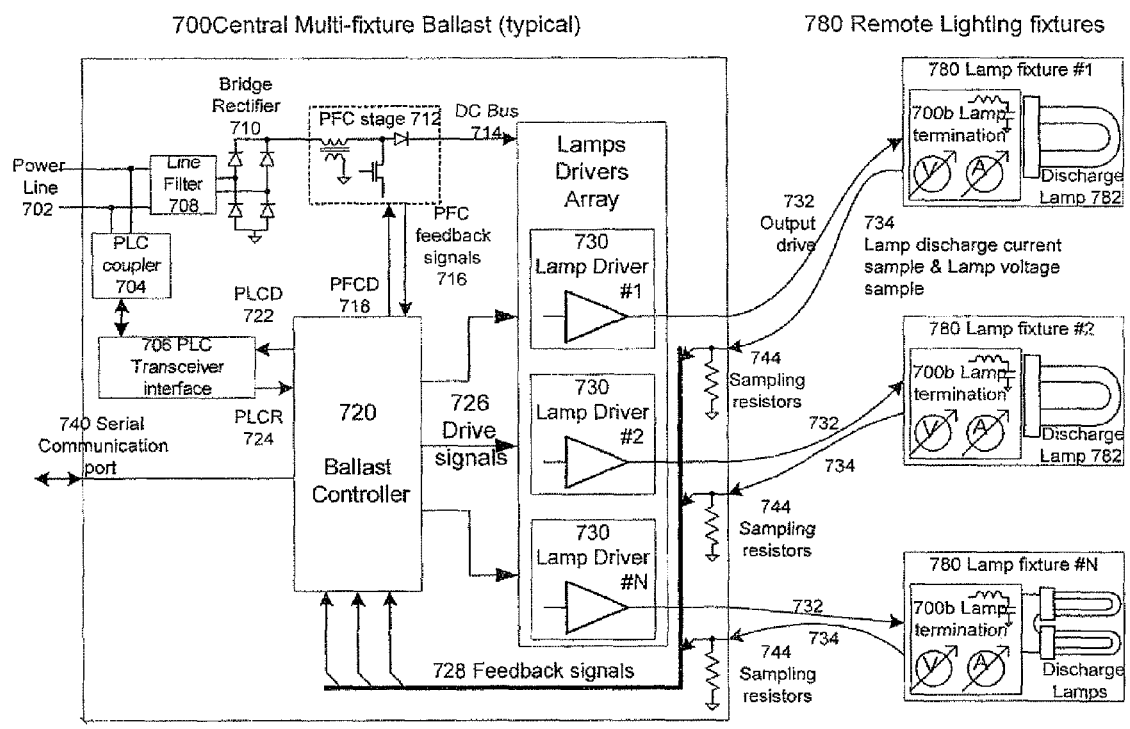
FIG. 9a shows a preferred embodiment of a central multi-fixture ballast (MFB)

FIG. 9a depicts a preferred embodiment of a central multi-fixture ballast (MFB) 700 that includes the control of a multiplicity of light fixtures 780. In the case of a multi-channel ballast 100 (FIG. 3a) where the lamp termination circuits are packaged together with lamps drivers 104 in the same enclosure, and the enclosure is located typically in the light fixture together with the lamps, the MFB is called a multi-lamp ballast. The characteristics of such a ballast are the following:

1. The ballast commands, controls, and protects separately a multiplicity of lamps in each fixture. Each lamp may have its own address (and/or pairs of lamps may be connected in series).
2. The ballast is using preferably a ballast controller such as controller 102 (FIG. 3a), most preferably the IDC, and an array of lamp drivers put together.
3. The ballast preferably uses the economical half bridge topology 200 (FIG. 4) for its lamps drivers.

Returning now to FIG. 9a, MFB 700 typically comprises a connection to a power line 702, which supplies the input power and is the medium for PLC communication. MFB 700 further includes a line filter 708 to prevent the pollution of power line 702, a bridge rectifier 710 to rectify the power line waveform, a PFC stage 712 to condition the power line input current and to create a regulated DC bus 714 for lamp drivers 730, a ballast controller 720 configurable for the application, and a serial communication port 740 for configuring ballast controller 720 prior to operation and on-the-fly. The PLC has bi-directional communication components in the form of a PLC coupler 704, and a PLC transceiver interface 706, which communicates with controller 720. The PLC, via a PLC receive input PLCR 724 of controller 720, is used for remotely commanding ballast controller 720, which in turn commands and controls lamp drivers 730 that drive remote light fixtures 780 with lamp terminations 750 to drive discharge lamps 782. The PLC transmitter, which is part of controller 720 and has as output PLC drive 722, is used to acknowledge commands, to report status, and to enable the use of the ballast as a medium of communication from optional sensors (not depicted) to other ballasts and controls on the same power line 702.

In operation, ballast controller 720 centralizes all the ballast activity. Among others, it manages the PLC communication, collects all feedback signals 716 and 728 of the system, and uses them to control the power stages including PFC stage 712 and lamp drivers 730. It also provides drive signals PFCD 718 and drives 726 for lamp driver 730 switches, and optionally (not depicted in FIG. 7a) to all other power switches of a system, including to optional emergency switches, auxiliary power supply switches, and others.

Lamp drivers 730 can be of several power topologies. Preferably, they are either independent half bridges, one half bridge per every light fixture for independent control of each and every light fixture. In such an embodiment, the light fixtures can use different lamps, and be controlled to different light levels, totally independent from each other. Alternatively, the lamp drivers are the innovative (economical) half bridge topology, with a common HS switch and multiple LS switches shown in FIG. 4. Using this topology, every light fixture can be addressed and individually controlled, but outputs have to be of about the same power (same lamps, same light), Alternatively yet, the lamp drivers may be a combination of the two, a few half bridges in the same ballast, each having one high side switch common to several low side switches.

The most common power topologies that can be used with the multi-fixture ballast are the known half bridge topology, and the economical half bridge topology disclosed herein. Both may suffer cross conduction problems when driving loads of capacitive nature. Wires 732 will naturally have their own resonance frequencies, which are higher than the ballast output drives 732 (the resonance frequencies due to the inductance of the wires and the capacitance between them). This results in the wire 732 impedance appearing capacitive to drivers 730, causing cross conduction problems in the drivers' 730 switches. We practically overcome this physical problem by providing a cable 732 that is as transparent as can be and cost effective. This we do by using a twisted pair cable for the 732 outputs drive (and its return).

From a mechanical point of view, wiring of the MFB system may present a problem to an installer of the system. This problem can be overcome by putting 732 drive wires and 734 feedback wires in a standard shielded cable with standard connections that will fit to the ballast and to the distant light fixtures. The cable can be of standard length e.g. 3 m, 5 m, 8 m etc.

Figure 3C:
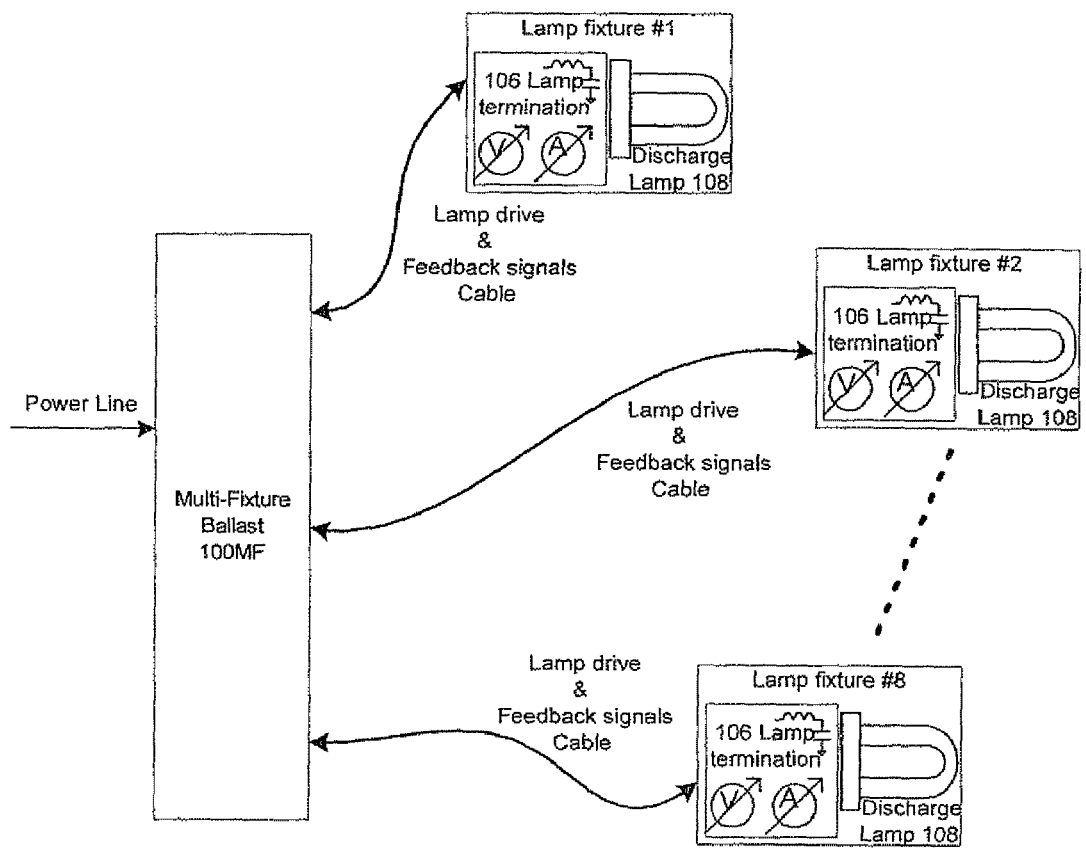
FIG. 3c shows a multi fixture ballast embodiment of the MCB of the present invention.

Equally, and within the scope of the present invention, a modular solution is provided that includes, as shown in FIG. 3c, a multi-fixture ballast 100MF that is of a certain power and certain number of outputs, and that can be used for a large variety of discharge lamps driving. The module has the ability to be reconfigured and/or have its numerical parameters changed to meet a required application, most preferably by using an IDC as a controller. The other modules of the suggested solution are the pre-mentioned cable (732+734) and lamp terminations 750, 752 that can fit with very slight (or no) changes to many types of discharge lamps.

Figure 9B:
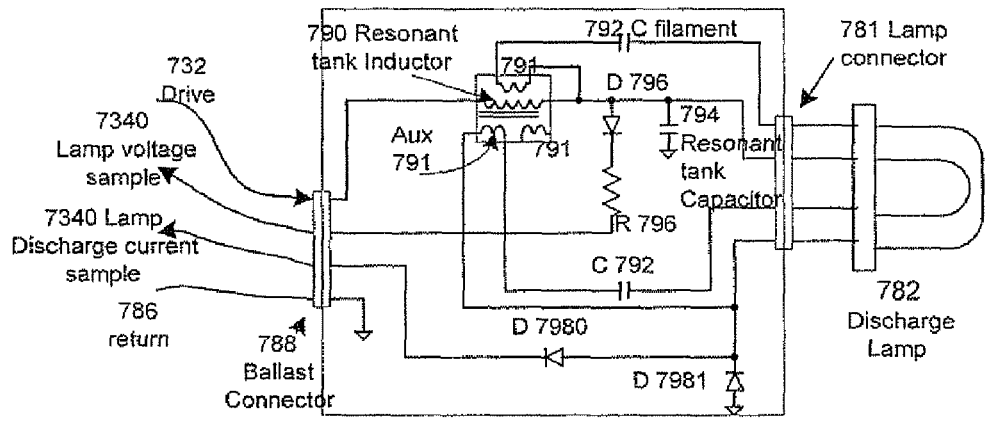
FIG. 9b shows lamp terminations for driving single lamps.
Figure 9C:
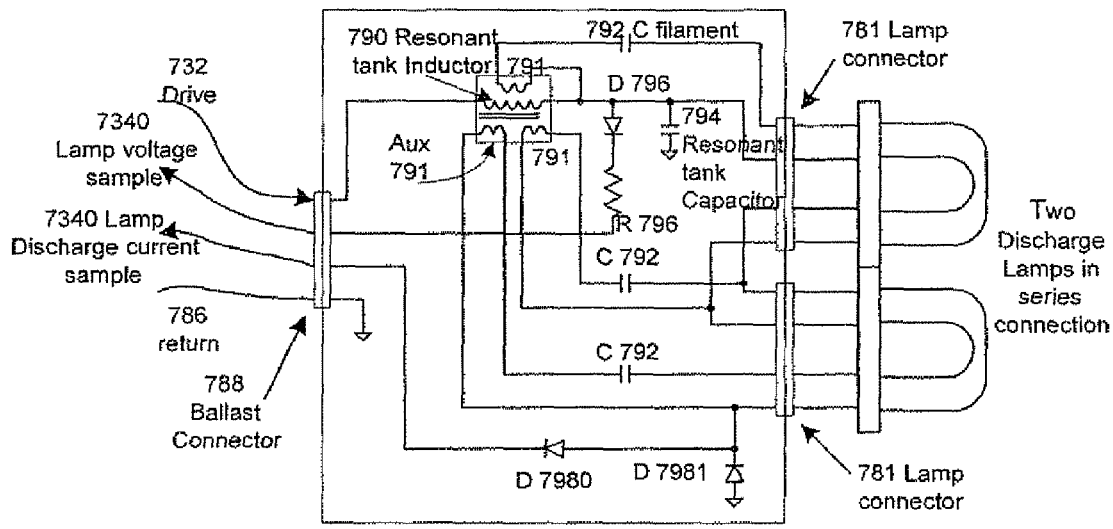
FIG. 9c shows lamp terminations for driving two lamps connected in series.

FIGS. 9b and 9c depict two types of lamp terminations: 750 for driving single lamps, and 752 for driving two lamps connected in series. 750 and 752 are very similar, except that 752 uses an extra winding of an inductor 790 for the common connected filaments of the serial configuration. An output drive 732 from MFB 700 lamp driver 730 (see also FIG. 9a) is applied to a resonant circuit inductor 790 and a resonant tank capacitor 794, with the lamp connected in parallel with capacitor 794 (via diodes D7980, D7981) and a sampling resistor 744 of MFB 700 (FIG. 9a). Inductor 790 has auxiliary windings 791 for the lamp filaments via capacitors 792.

The distance between MFB 700 and light fixtures 780 may affect the signals coming from a fixture to be inaccurate, and the signals may become distorted and polluted. To solve the problem, we start by rectifying the signals by diodes 796 (voltage) and 7980 and 7981 (current) at lamp terminations 750, 752. By this we ensure that AC pollution will not affect a DC lamp voltage sample 7980 and a lamp discharge current sample 7981. The DC signals can easily be filtered.

The attenuation of the wires to the DC component is negligible, which is very important at low light levels. The signals are sent as current sources, and are converted to voltage signals across resistors 744 at MFB 700. Each resistor 744 represents two resistors, one for lamp voltage sample 7340 and one for lamp discharge current sample 7341.

Another option for lamp current sensing (not depicted in the figures) is to use a current transformer with half or full wave rectification, preferably located at the a lamp termination 750, 752, the DC signal preferably sent differentially to ballast 700, where it is detected across resistors 744. In addition to lamp current and lamp voltage, lamp terminations 750, 752 may include circuitry for sensing of lamp filaments voltage, temperature sensing, and light level sensing—all at the level of lighting fixture 780. The sensed information is then sent to ballast 700, where it may be processed and used for the lighting control. The sensed information may also be reported further to a remote center using PLC transceiver interface 706 or serial communication 740.

Direct Sequence Spread Spectrum (DSSS) Modem and Method

The following describes a Direct Sequence Spread Spectrum modem (DSSS-modem) and a method that provides advantageous communication in a control system using PLC communication such as that of FIG. 1, particularly under the following specified conditions: 1) high noise level; 2) limited low frequency band; 3) limited duration of the transmitted information blocks; and 4) limited access time. Conditions 2, 3 and 4 are contradictory.

Figure 10A:
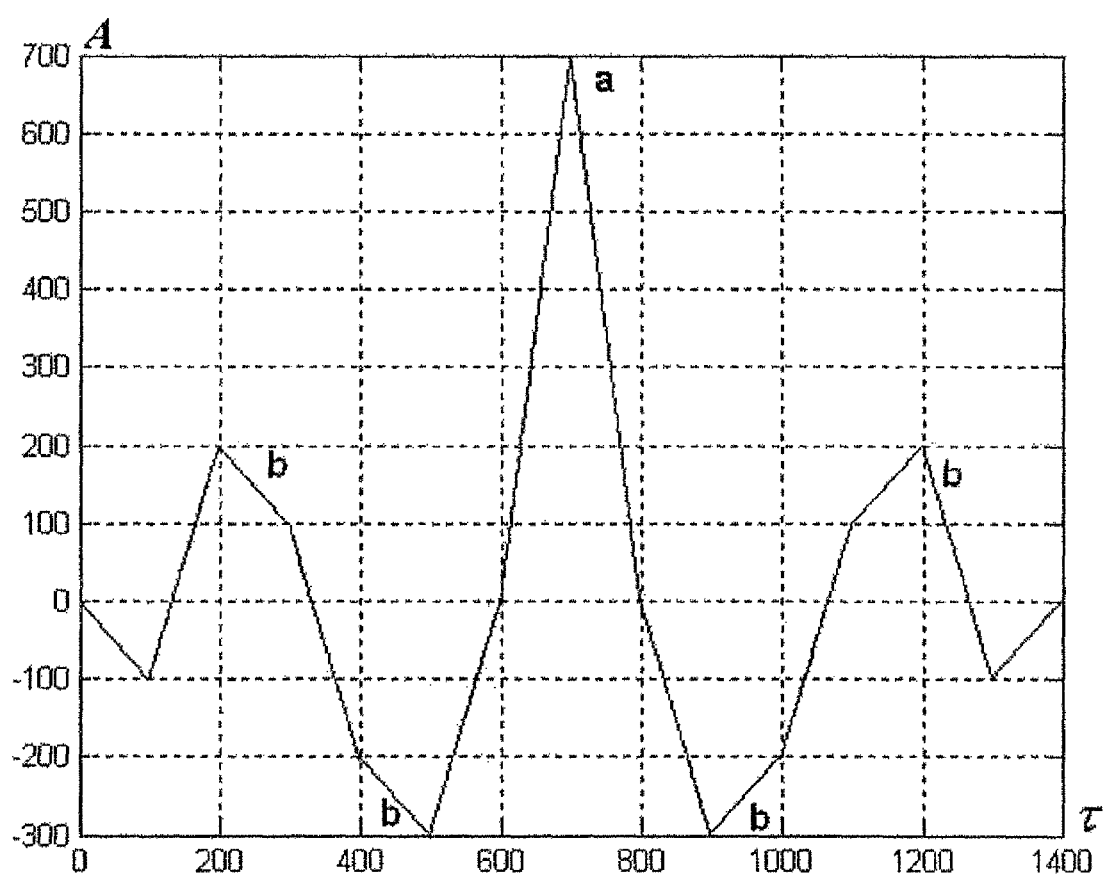
FIG. 10a shows a correlation function (CCF) of a single data symbol encoded by a seven PN sequence.

Point 1 implies the use of the well-known Spread Spectrum (SS) techniques (correlative or coherent) due to its excellent noise immunity. However, these techniques do not satisfy all the above contradicting requirements (namely points 2, 3, and 4). In case of coherent receiving, the technique requires time losses for synchronization. In case of correlative receiving, we must use rather long pseudo random sequence (pseudo noise or PN codes) for symbols encoding, because short PN codes have high side lobes of a cross-correlation function (CCF). This decreases the signal to noise ratio (SNR). An example of such a CCF is shown in FIG. 10a, in which a correlation function $A(\tau)$ between two single data symbols encoded by the same 7 bit PN sequences ($\tau$ is the time shift between the symbols). This Figure shows a main lobe "a" and side lobes "b". The side lobes have about half the amplitude of the main lobe.

Figure 10B:
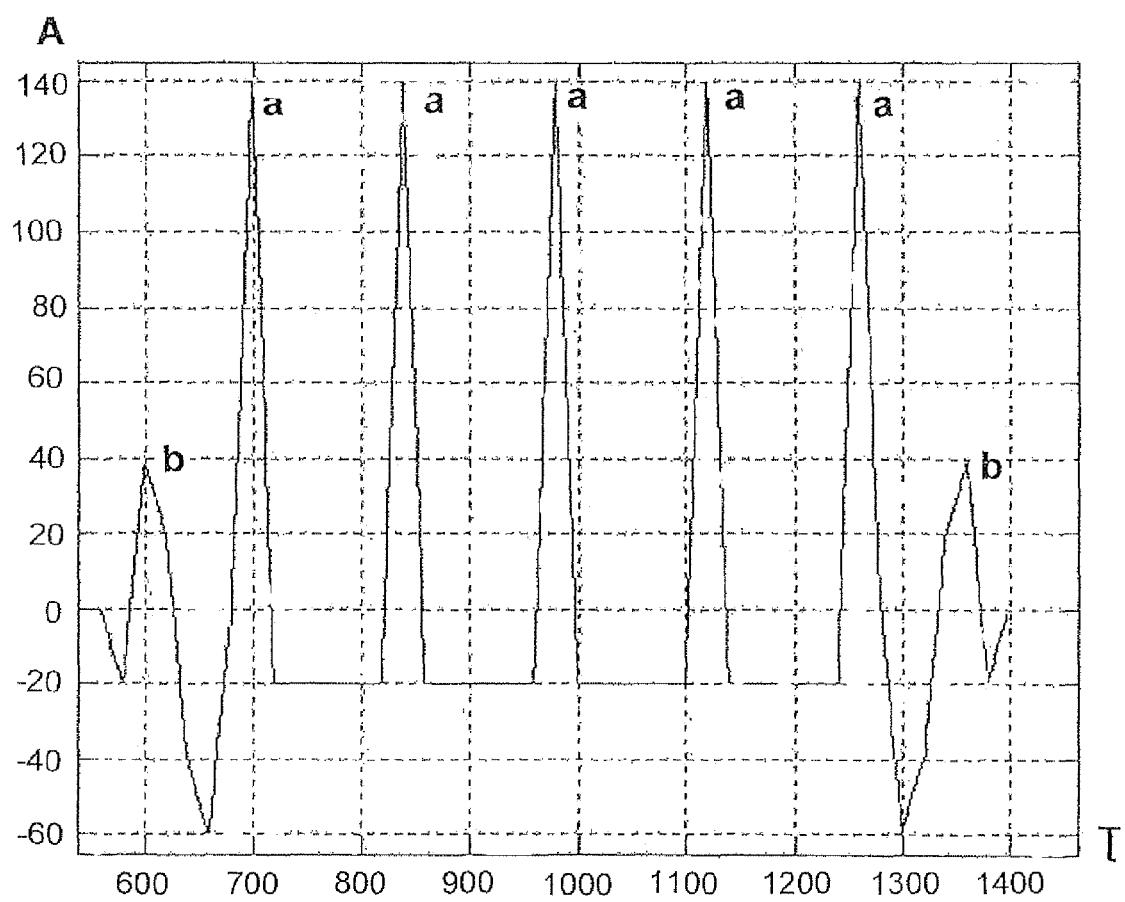
FIG. 10b shows the cross correlation function of a reference, and five data symbols, each encoded by the same 7-bit PN sequence.
Figure 10C:
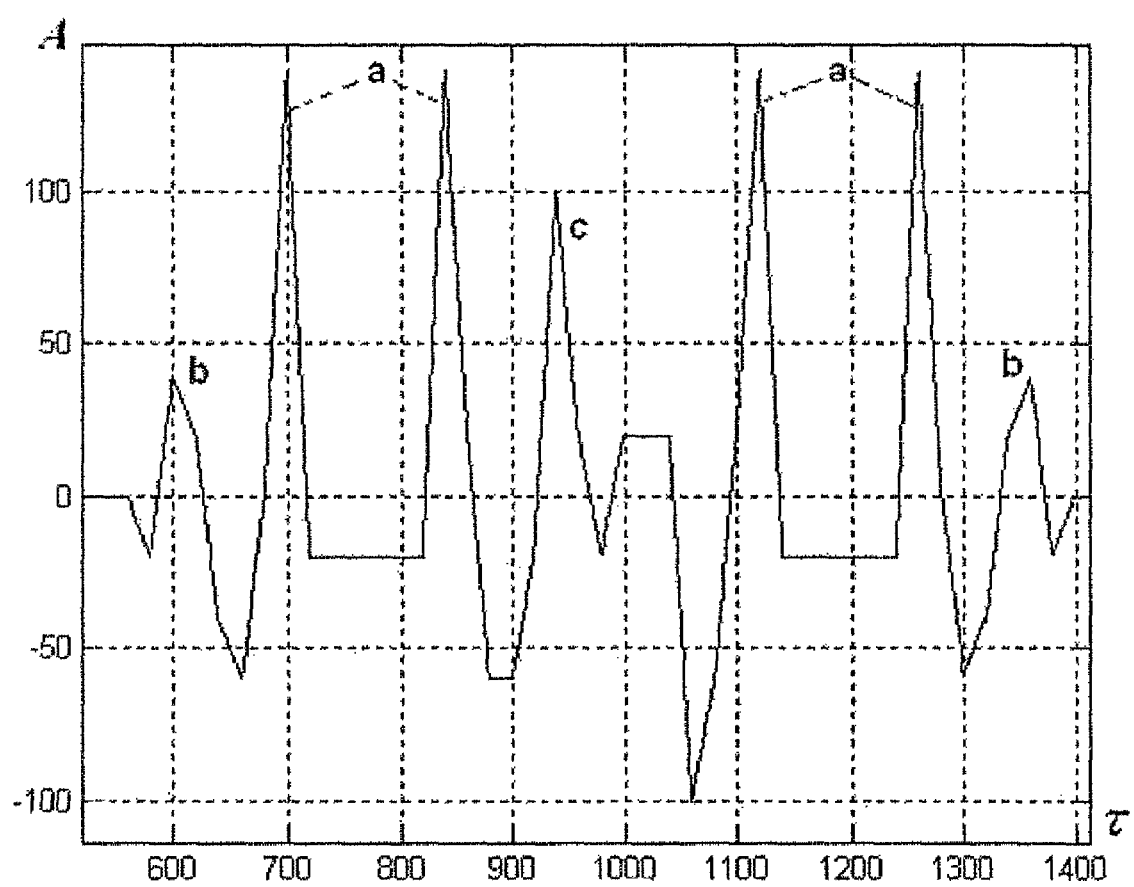
FIG. 10c shows the cross correlation function of a reference PN sequence r, and the received data symbols S1 and S2 encoded by two different PN sequences.

As shown in FIG. 10b, the situation seems better when we receive a series of a few data symbols encoded by the same (in this case 7) PN-sequences. Side lobes are very much reduced everywhere between main lobes a, except at the two boundaries of the data packet marked "b". The worst situation occurs when we need to encode the several data symbols by different PN codes. As shown in FIG. 10c, there is an additional impediment due to the CCF of the two PN codes. The figure shows a case in which the CCF of a reference PN sequence and the received data symbols are encoded by two different PN sequences. "a" marks the CCF of the reference and a first symbol, while "c" marks the CCF of the reference and a second symbol.

Figure 11:
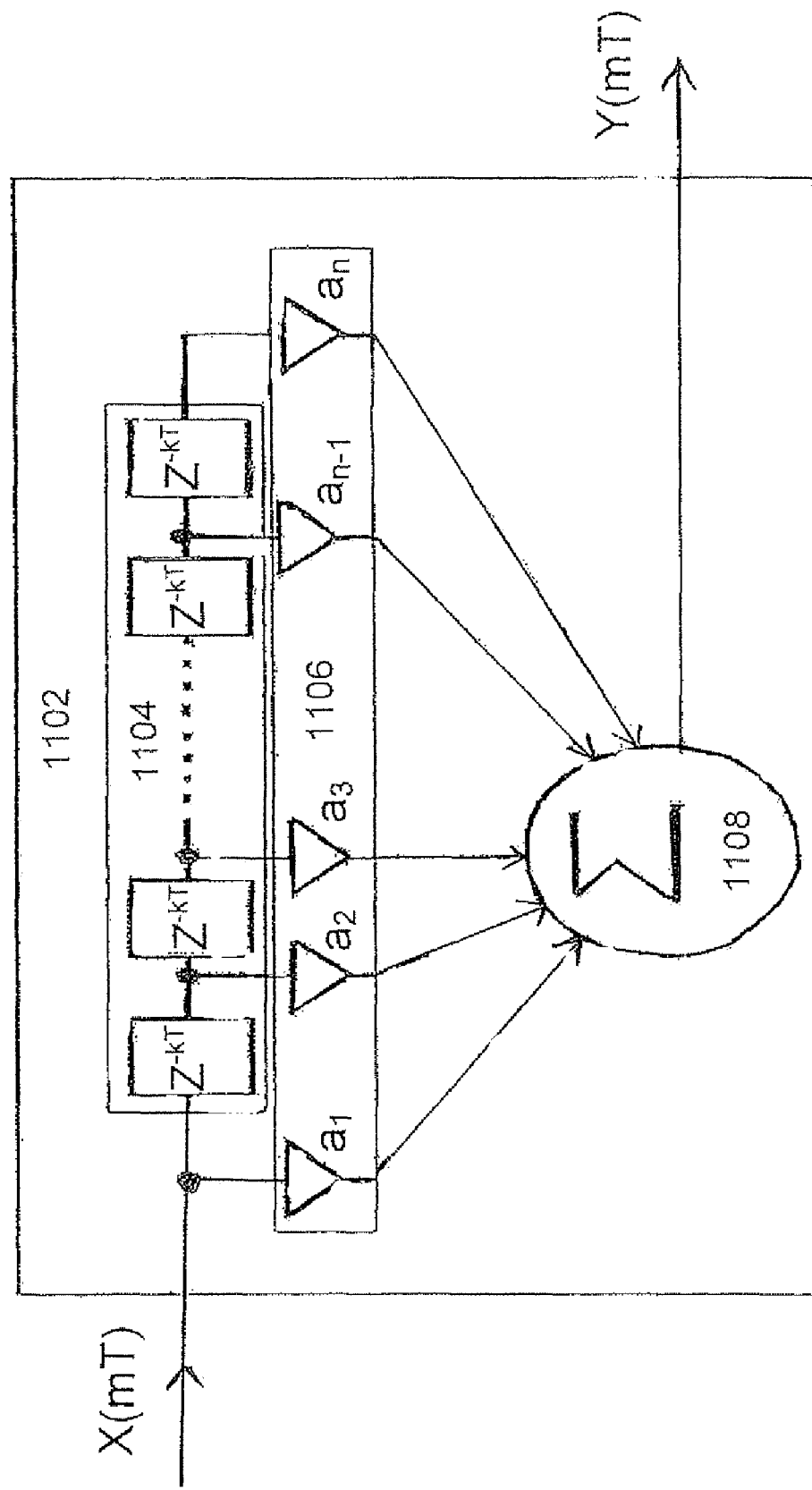
FIG. 11 shows a well-known prior art two level discrete correlative detector.

The output signal of a correlative receiver (detector), see e.g. FIG. 11, is the CCF of the reference and the input signal. Hence, such a receiver has sizeable cross talk. Obviously, if we need, for example, a low cost modem to transmit a single short data burst of 32 bits or less, for a duration of 10-20 ms with a carrier frequency of 100 kHz, using any of the above techniques is practically impossible.

The problems discussed above stem from the algorithm of the signal detection, as presently used. This algorithm is based on the cross-correlation coefficient estimation between a reference and input signals. The distinguishing capability increases with the increase of the PN code length (n) but this is contradictory to our goal: to use a short PN code.

FIG. 11 shows a well-known two level discrete correlative detector (filter) 1102 matched with an n-bit input signal $X(mT)$ that can possess two possible values: +1 and −1. Detector 1102 typically comprises of (n−1)-taps delay line 1104, a set of coefficient multipliers 1106, and an adder-integrator 1108. The input signal shifts through the delay line with a sample period T. The delay between two adjacent taps is kT, where k is the number of samples per bit of the detected sequence.

The detector performs a convolution of the input signal with a reference sequence represented by coefficients $a_1 \ldots a_n$ in 1106 These coefficients have one of two values +1 or −1 according to the reference sequence. Taking into account the signal and the coefficients values (±1), we can consider the multiplication as a procedure of signs comparison. In effect, a positive value on the multiplier output indicates there is coincidence, i.e. the same "+" or "−" of the signal and the coefficient signs. A negative value indicates opposite signs. The output absolute value is always 1. One sample from each bit of an input signal is compared to the reference sequence.

Adder-integrator 1108 adds up the results of all sign comparisons. The output signal $Y(mT)$ is the algebraic sum of the comparison results, and looks like the signals shown in FIG. 10. The main lobe forms when an input signal is completely coincident with the reference. Side lobes are the result of partial coincidence of an input signal and the reference.

The solution proposed herein is to receive the signal with an algorithm that suppresses the side lobes of the short binary sequence correlation function, and eliminates the cross talk between symbol detection channels. Accordingly, the present invention discloses also an improved transmitting and receiving apparatus and method for data communication using a spread spectrum signal.

The main idea of the modification leading to the improvement is that in order to eliminate side lobes, it is necessary to detect the matching of the signal and the reference. That is, we must analyze all "n" comparisons in each shift step, and produce a binary signal +1 or −1 ("true" or "false"), according to the match of the analyzed samples and the reference. This output binary signal must be further integrated in a counter-integrator. In contrast with prior art, the integrator in the present embodiment has one input, and the sum accumulating inside the adder-integrator increases or decreases by 1 each shift. When the samples of the input signal begin to coincide with the reference, the number in the integrator increases step by step up to a maximum. Otherwise, it decreases to zero. The counter-integrator's overflow must be forbidden.

It is possible that combinations like the data symbol "1" or "0" will appear on the delay line taps, when the matched signal is absent on the receiver's input. The probability of such event is $$P = \frac{1}{2^n}.$$

If this happens, the sum in the counter increases. However, the probability of a series of i such combinations is:

$$P_i = \left(\frac{1}{2^n}\right)^i,$$

and it decreases very quickly as i increases. This means that the sum in the counter-integrator will never (or with negligible probability) reach the sum N=i, and will always be close to zero. This oscillation of the number in the counter-integrator depends on the SNR. If we choose i as the threshold level, we can safely assume that the false alarm probability will not be greater than $P_i$. If the integrator's output value reaches and exceeds the threshold level i, the meaning is (with probability $P_s=1-P_i$) that the matched sequence has been achieved.

Figure 12:
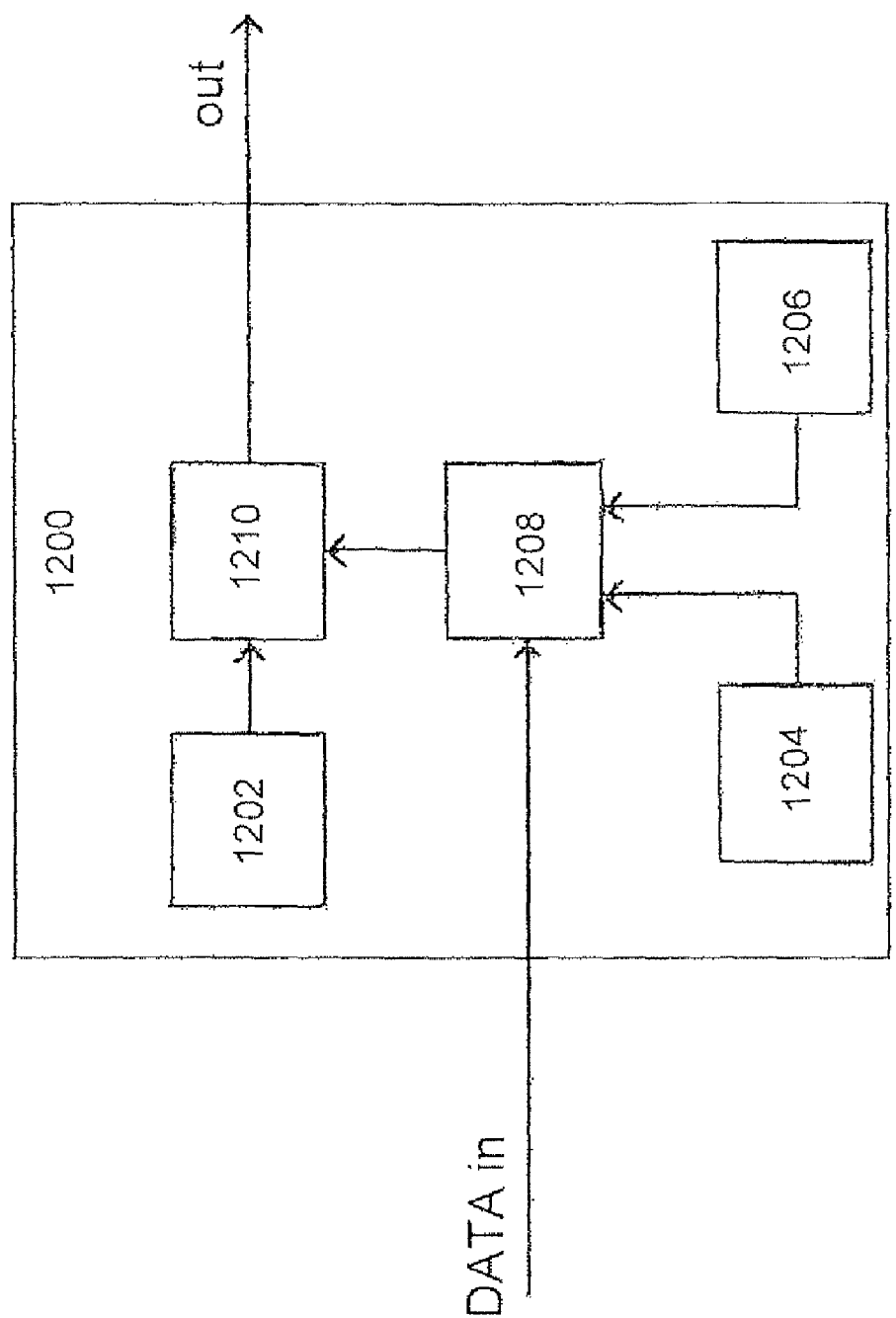
FIG. 12 shows a transmitter used to implement the direct spread spectrum method of the present invention.
Figure 13:
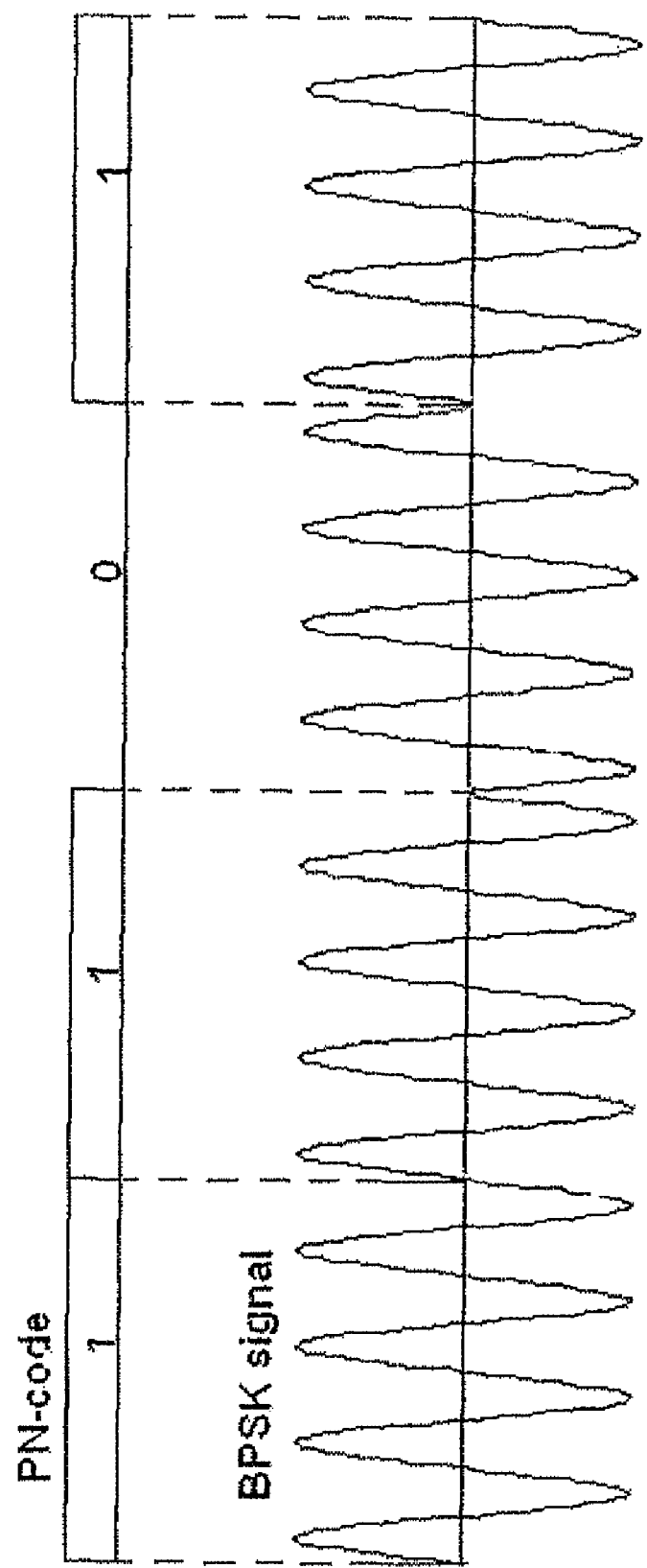
FIG. 13 depicts the part of a PN sequence (code), and the transmitter's output signal modulated by this PN sequence.
Figure 14:
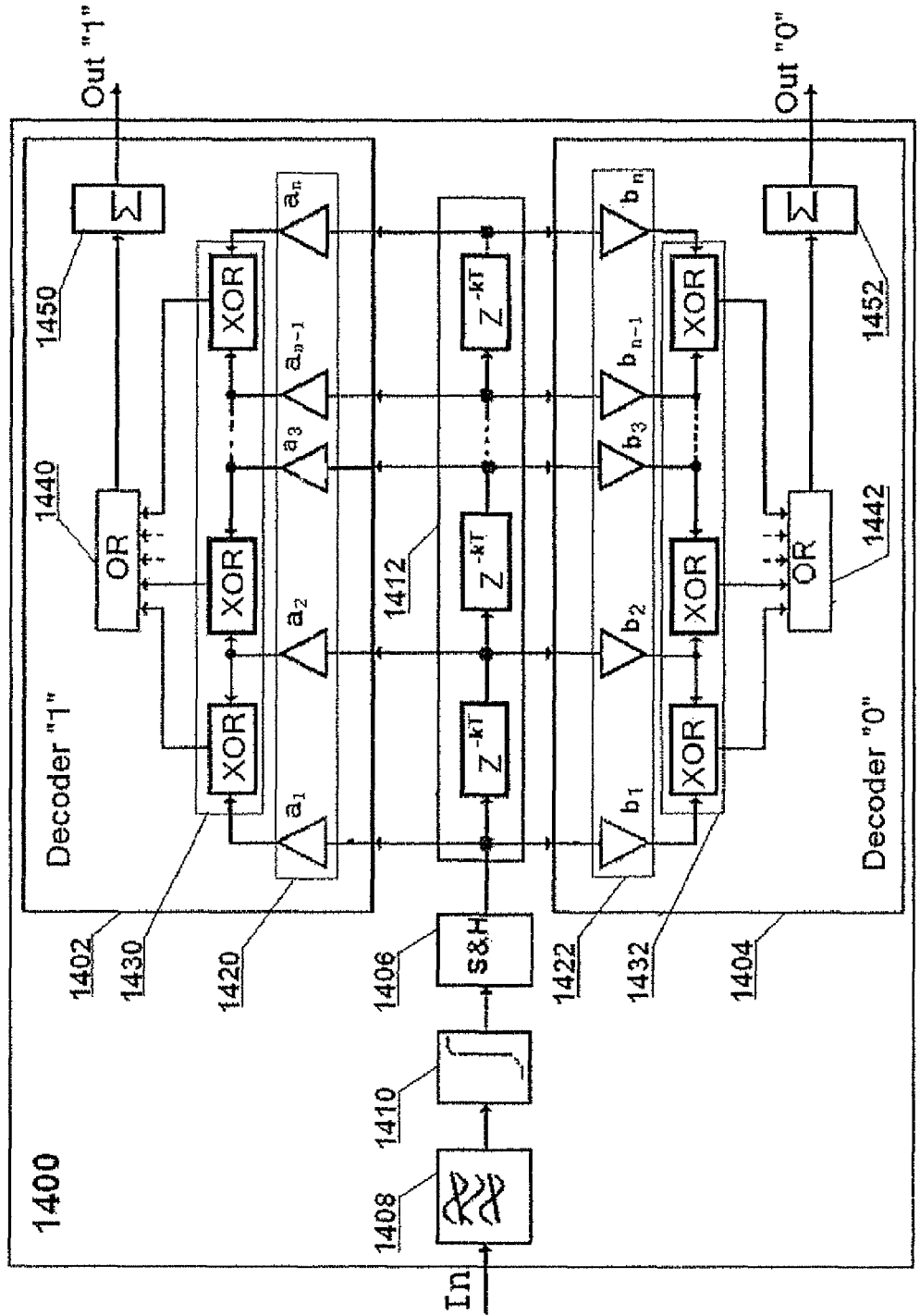
FIG. 14 shows a simplified receiver used to implement the direct spread spectrum method of the present invention.

The modification described above is implemented with a system (modem) that comprises a transmitter and a receiver. The transmitter is shown in FIG. 12, and the receiver is shown in FIG. 14. FIG. 12 shows a transmitter 1200 that includes a sinusoidal carrier frequency oscillator 1202, two binary PN series generators 1204 and 1206, an encoder 1208 and a phase modulator 1210 that produces an output BPSK (Binary Phased Shift Keying) modulated signal. Data symbols "1" and "0" are transmitted by two different n-chip BPSK sequences. The carrier phase of the "1"-chip is shifted by 180° relative to the "0"-chip, as shown in FIG. 13. A preferred embodiment of the modem is a half-duplex communication modem with CDMA DSSS BPSK modulation. A range of working frequencies is typically 95-135 kHz.

FIG. 14 shows a block diagram of a simplified receiver 1400. The receiver comprises two symbol decoders 1402 and 1404, a sample and hold unit 1406, a band pass filter 1408, an amplifier-limiter 1410 and a delay line 1412 with n−1 taps. For short data symbols, one decoder is enough. An analog input signal (input IN) is sampled by sample and hold unit 1406 after filtration by filter 1408, and limited by amplifier-limiter 1410. The sample frequency is: $F_s=r*F_c$, where $F_s$ and $F_c$ are the sample and carrier frequencies respectively, and r is the sample rate. The discrete sequence passes through a delay line 1412. The delay between two adjacent taps is $T_t=k*T_s=r*k*T_c$, where $T_t$ is the delay between taps, k is the number of carrier periods per chip, and $T_c$ and $T_s$ are the carrier and sample periods respectively. The number of taps is equal to the number of chips in the symbol minus one.

The structure of the two symbol decoders 1402 and 1404 is similar. Two symbol decoders are shown as an example only. As those knowledgeable in the art will realize, it is possible to use one decoder matched with one data symbol, in which case very short sequences may be applied for data symbol encoding. More than two decoders may be employed too. In the most general case, the DSSS method disclosed herein is implemented with a system having at least one symbol decoder.

The delayed signal samples are multiplied by weight coefficients 1420 $a_1 \ldots a_n$, and 1422 $b_1 \ldots b_n$. These coefficients repeat the symbol's n-chip sequence. The multiplication on the "0" position inverts the signal, and the multiplication on the "1" position does not change it. Thus, if a combination of samples on the delay line taps is coincident with the reference, the same binary value (zero or one) of the signals will be on each multiplier output.

A set of logic XORs (1430 and 1432) compares the signals on the adjacent outputs of the multipliers. In case of signals parity, there will be zeros on every logic XOR output, and a zero on a logic OR (1440 and 1442) output. Otherwise, at least one XOR output value will be nonzero, and the same value will be on the OR output. Thus, the described unit detects coincidences of samples on the delay line taps with the reference according to the above proposed algorithm. The set of logic XORs and the logic OR are together referred to as "comparison means" or comparator. It will be clear to anyone knowledgeable in the art that a comparator may be implemented with other architectures, all of which fall within the scope of the present invention.

The receiver further comprises integrators 1450 and 1452, which are up-down counters with inverse input and overflow disabled. Each such counter adds "1" if there is "0" on its input (the case of absolute coincidence) and subtracts 1 otherwise (the case of absolute or partial non coincidence). The number N on its output corresponds to the correlation function of the main lobe of the signal. The maximum possible number may reach N=r*k when noise is absent at the receiver input, and decreases depending on the SNR at the input. It will be clear to anyone knowledgeable in the art that an integrator or summer may be implemented in various ways, all of which fall within the scope of the present invention.

Figure 15:
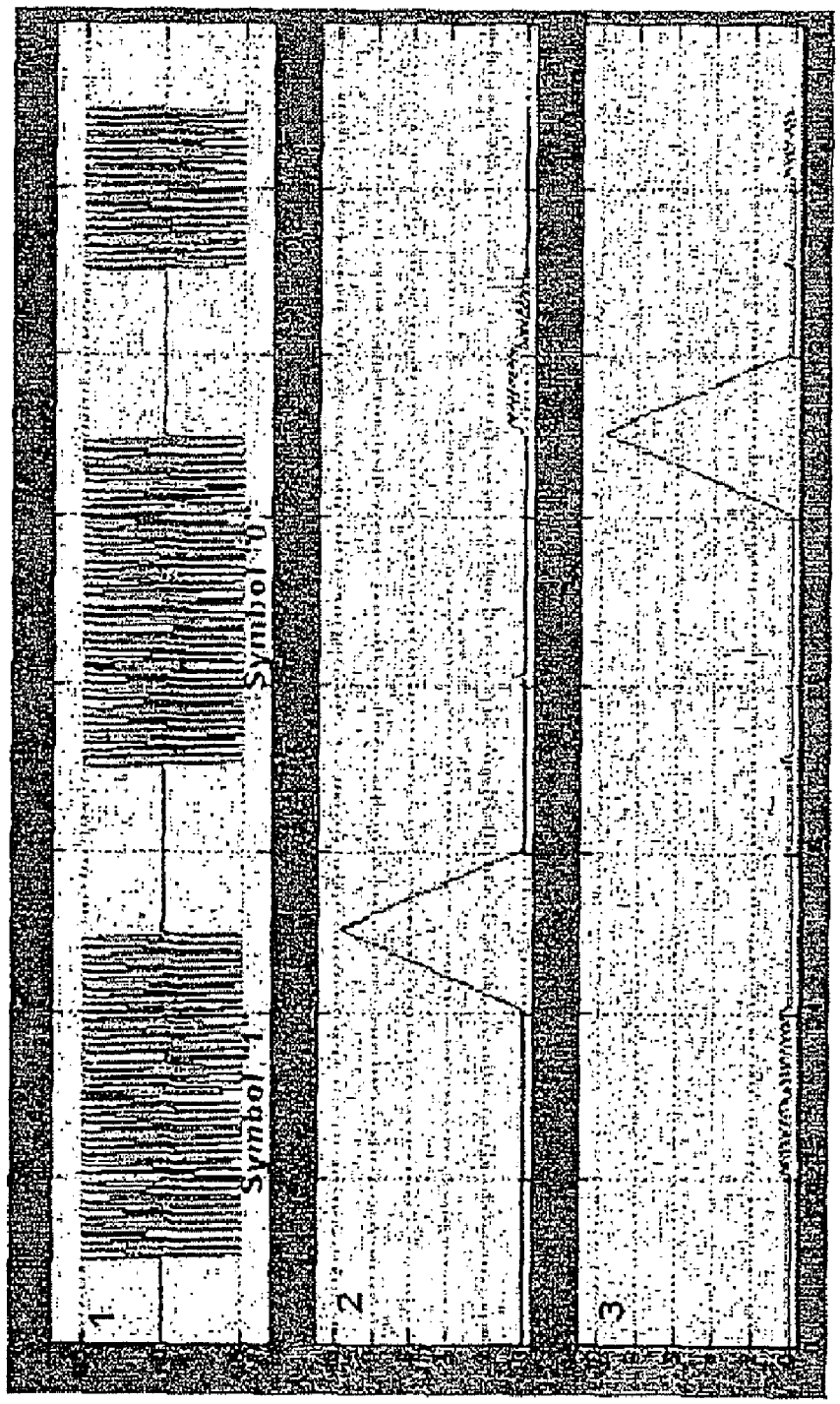
FIG. 15 depicts a receiver's BPSK input signal, and output signals of two symbol detectors.
Figure 16:
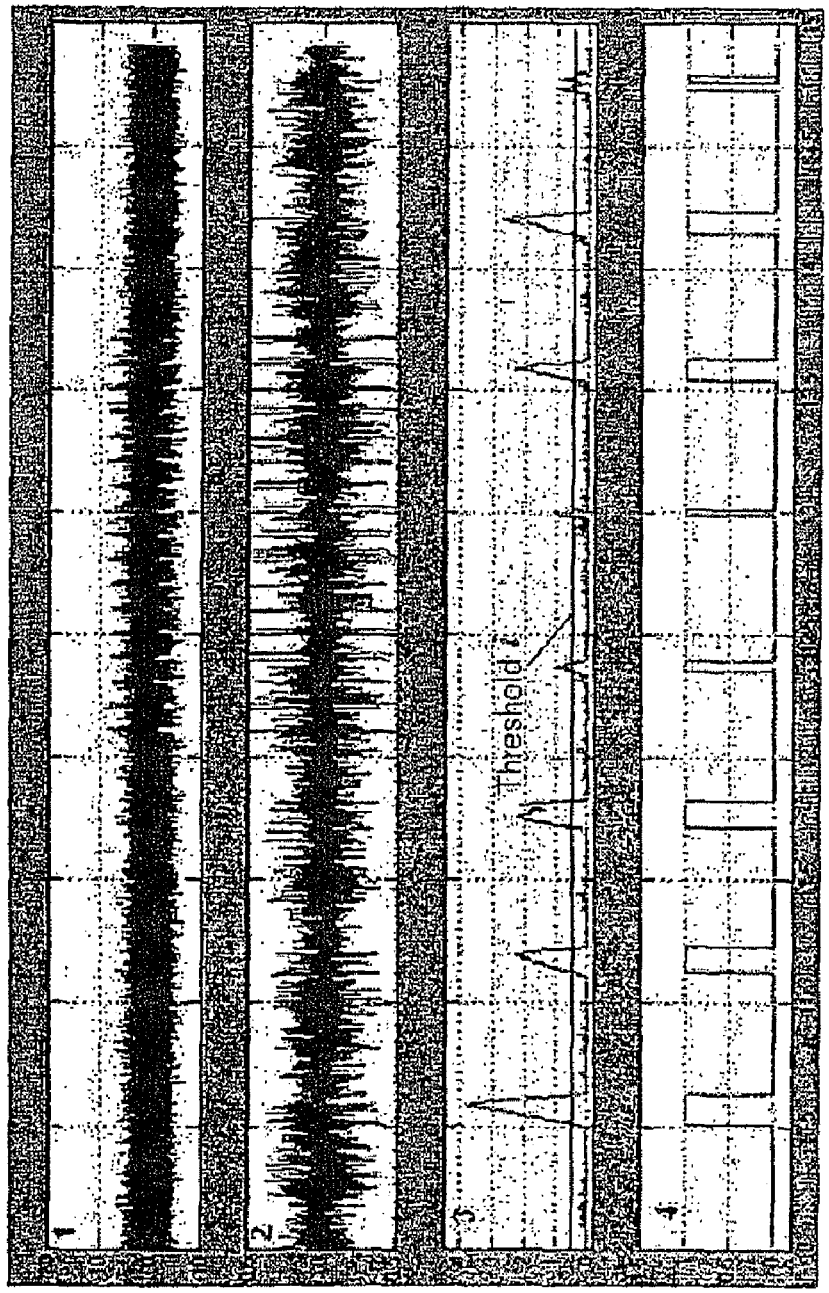
FIG. 16 shows the results of a MatLab simulation.

FIGS. 15 and 16 illustrate the integrator output signals with and without noise on the receiver input. FIG. 15 depicts a receiver's BPSK input signal, and output signals of two symbol detectors. The input signal (graph 1) is the series of two data symbols ("1" and "0") encoded by two different 4-bit sequences. Graphs 2 and 3 are the output signals of detector "1" and detector "0" respectively. FIG. 16 shows the results of a MatLab simulation. Graph 1 shows the sum of the signal (symbol "1") with white noise (SNR=3 dB) and burst pulse disturbances. Graph 2 depicts an input signal with noises after being filtered in a band-pass filter such as filter 1408. The output signal of detector "1" and a threshold value i are shown on graph 3. The signal in graph 4 is the result of the comparison of the detector's output value with threshold value i.

Figure 17:
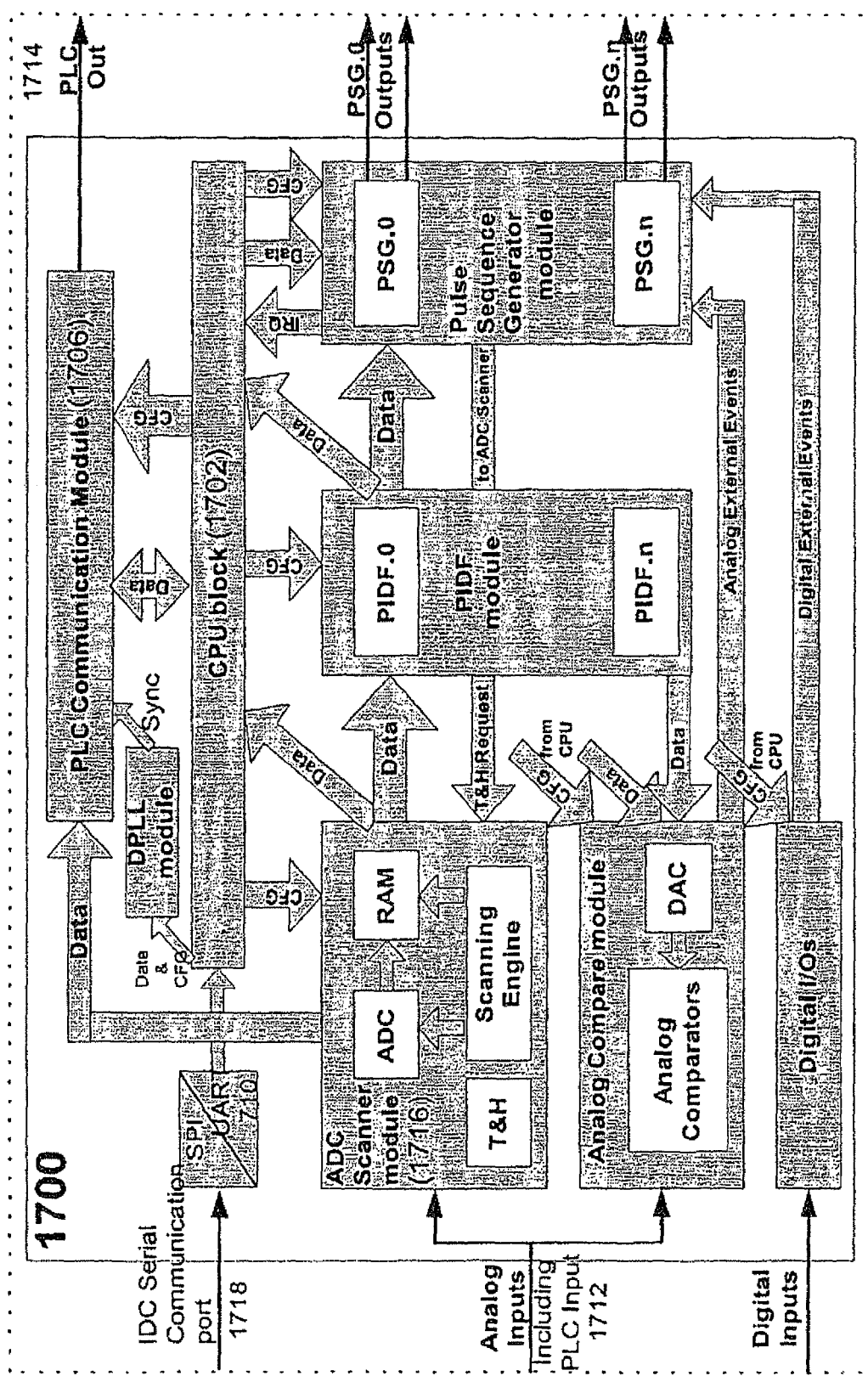
FIG. 17 shows an Integrated Digital Controller disclosed in U.S. Patent Application No. 60/384,410.

FIG. 17 shows a block diagram of an integrated digital controller 1700 disclosed in U.S. Patent Application No. 60/384,410. All further references to element numbers of the IDC are made with reference to FIG. 17, whereby the appropriate explanations of each element can be found in the above-mentioned application.

Figure 18:
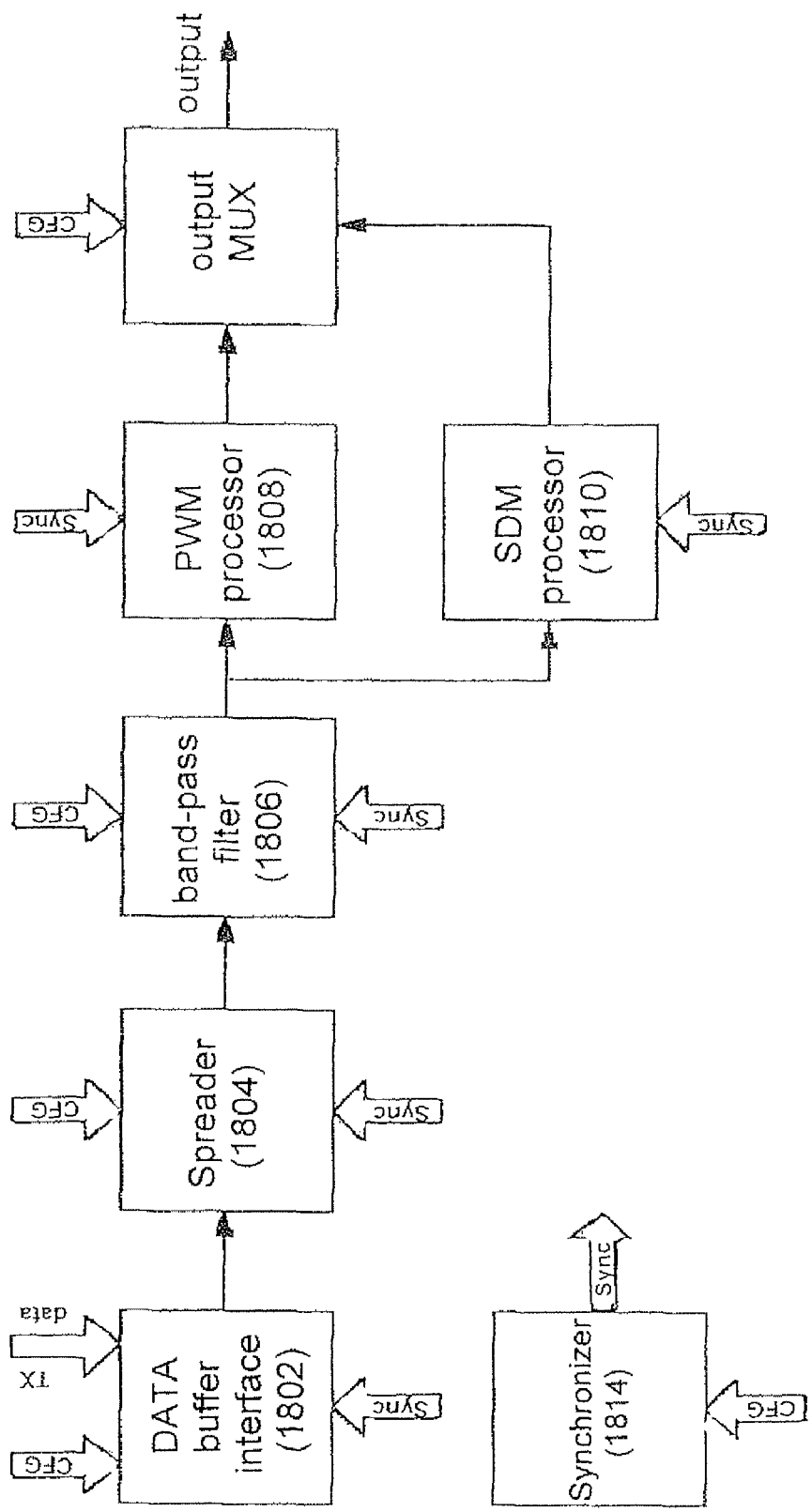
FIG. 18 shows a block diagram of the preferred embodiment of a DSSS-modem configured in a transmitter mode.

FIG. 18 shows a simplified block diagram of a preferred embodiment of a PLC communication module 1706 of IDC controller 1700 configured in a transmitter mode. A data buffer interface 1802 is configured from CPU controller block 1702 of IDC controller 1700 to work in a TX (transmission) mode. It writes TX data, byte after byte, into an internal FIFO memory of data buffer interface 1802. A synchronization signal start event from a synchronizer 1814 puts the first bit of the transmitted data on the input of a spreader 1804. According to the principle of DSSS, in case of a logic value of "1" or "0", the spreader reads from an internal sequence table instantaneous amplitude values of the carrier, and multiplies these values by the normalizing coefficient calculated in the previous state according to the carrier frequency. A stream of those values is passed through a bandpass filter 1806, which limits the frequency band of the transmitted signal according to the regulatory requirements related to PLC communication. Depending on the target application and the external hardware, the conversion of the filtered digital signal values to analog signals may use an SDM 1810 digital to analog converter or a symmetrical three-stage PWM (Pulse Width Modulator) 1808.

Figure 19:
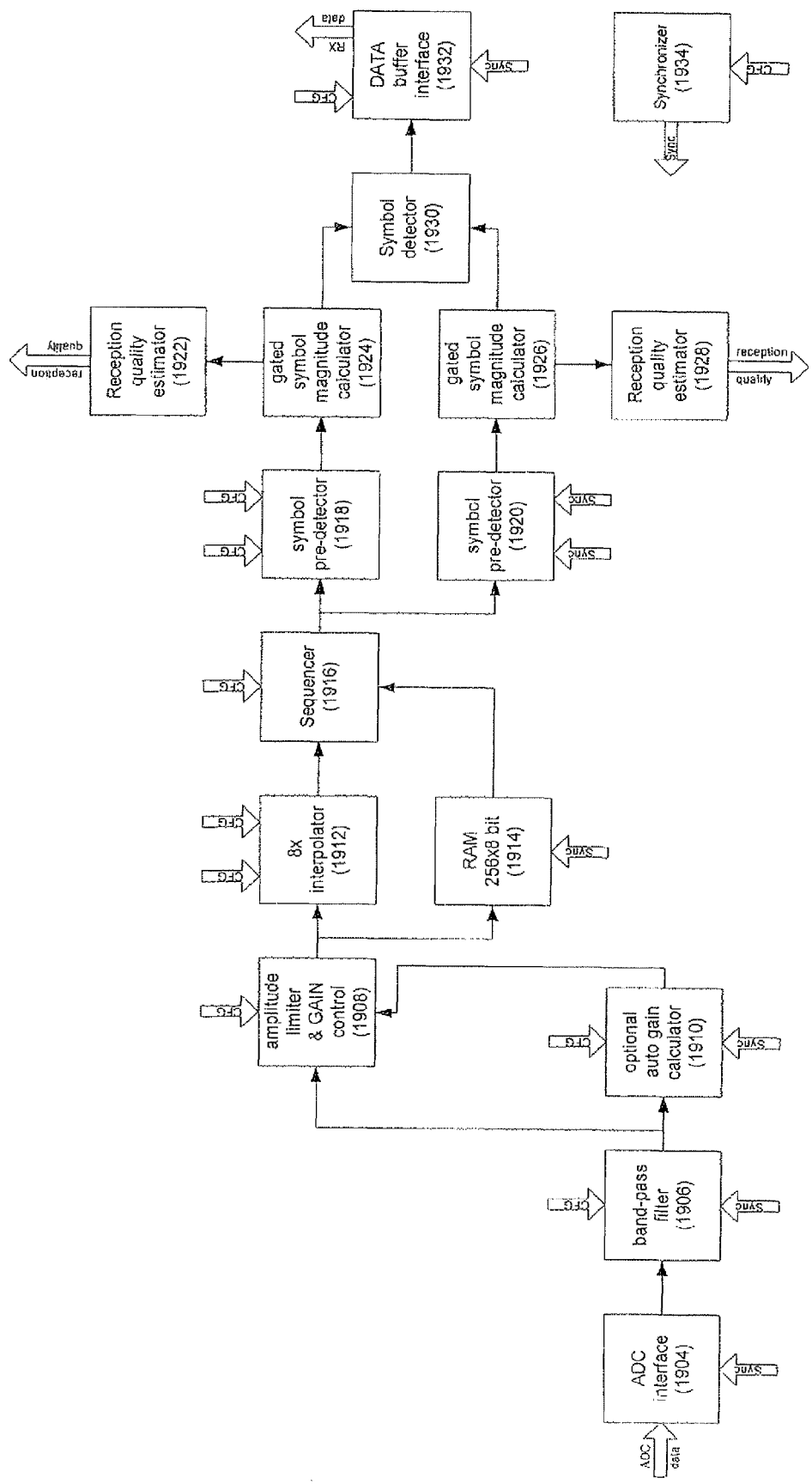
FIG. 19 shows a block diagram of a preferred embodiment of a PLC DSSS modem configured in a receiver mode.

FIG. 19 shows a block diagram of a preferred embodiment of a PLC modem configured in a receiver mode. The following is also a description of a method of its use. Data from a special PLC analog input is converted in an ADC scanner module 1716 of IDC controller 1700, and delivered to a modem RX (receiving) data input according to requests of a modem synchronizer 1934. An ADC interface 1904 recognizes the relevant data by the number of the channel of scanner module 1716, changes the data format, and re-synchronizes and buffers the digital value of the input signal. A FIR band-pass filter 1906 limits the frequency band of the received signal. Amplitude limiter and gain control block 1908 correct the signal amplitude according to the gain value set by CPU block 1702, or calculated by an auto gain calculator 1910.

To increase the precision of the zero-cross detection, linear interpolation of the signal values around the zero-cross point is used in an 8X interpolator 1912. In comparison with a complicated interpolation filter, direct cross-to-cross time calculation is much faster, easier, and provides accurate enough results. The sign of the signal and its duration are coded, re-formatted, and stored in a RAM 1914. The position of this information is calculated in the address counter and re-synchronized at the end of each frame.

The above sign and duration information is extracted from the relevant addresses. The addresses are shifted according to the chip duration. This information is converted to a number of individual sequences in a sequencer 1916. The reconstructed time-shifted input sequences in form of bit-streams are converted to word streams.

According to this method, symbol pre-detectors 1918 and 1920 compare the time-shifted signs of the signals with the pre-defined symbol codes during the existence of the sign. Instead of a simple XOR function, a non-linear conversion based on code distance calculation is used. A non-linear conversion engine implemented by a table is not configurable, but allows switching in linear mode by CPU block 1702. Two bit-streams from the pre-detector engines are integrated in gated symbol magnitude calculators 1924 and 1926 by simple up-down counters with reset, at the end of the projected symbol end time.

Maximal values of integrators across the symbol time window (symbol magnitude) are compared in a symbol detector 1930 with symbol thresholds, and one with the other. The symbol thresholds are pre-calculated by CPU block 1702 by using the results from two reception quality estimators, 1922 and 1928. The comparison result is the symbol code and the signal quality estimation. In the case that all symbol magnitudes are lower than the threshold, the meaning is "NO Detection". In the case that all symbol magnitudes are equal, the meaning is "Error Detection". The number of "Error Detection" and "NO Detection" events counted at the end of the frame determines the receiver response. If the number of non-recognized symbols and erroneous symbols does not exceed the maximum values pre-set by CPU block 1702, the receiver will set the interrupt line to CPU block 1702 in active mode.

Anti Collision Protocol

Figure 20:
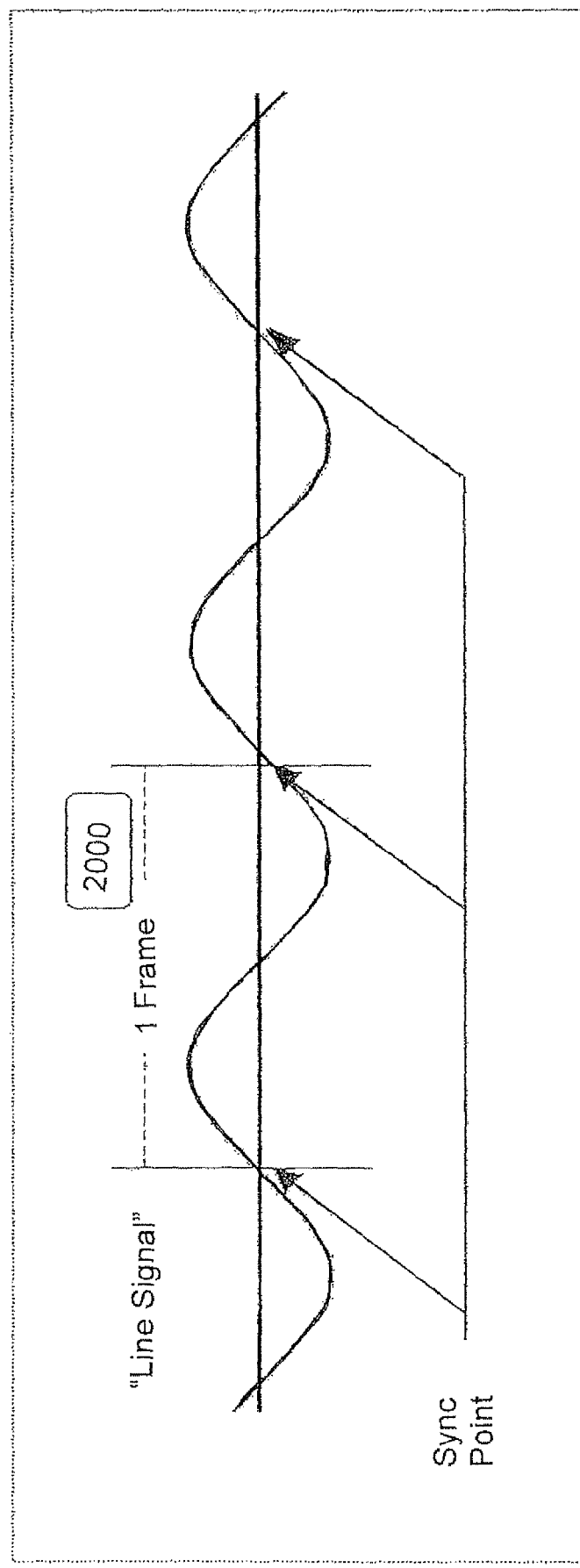
FIG. 20 shows the synchronization of protocol frames to a power line.
Figure 21:
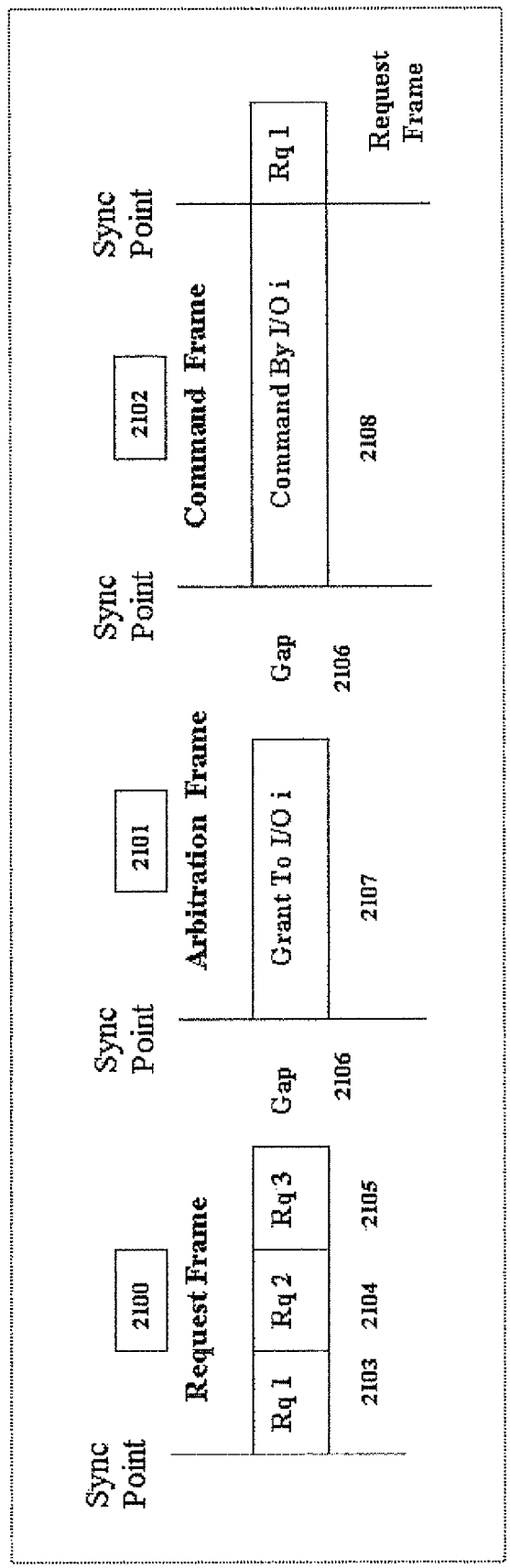
FIG. 21 shows a timing diagram that demonstrates an arbitration sequence in an anti collision protocol according to the present invention.

FIG. 20 shows a typical synchronization of protocol frames to the power lines in any embodiment requiring such a protocol described above. An anti collision protocol according to the present invention is based on a three-frame regime, shown in FIG. 21. Each frame is synchronized to the zero cross of a mains signal 2000 in FIG. 20. The first frame, frame 2100 in FIG. 21, is a Transmit Permission Request (TPR) frame. The second frame, frame 2101 in FIG. 21, is an Arbitration/Grant (A/G) frame, and the third frame, frame 2102 in FIG. 21 is a Command frame. The Command section can be extended to more than one frame in order to support complex commands. The A/G frame has a distinct identification and indicates a start of a new control cycle. The Arbitration/Grant frame is also the frame that tells the transmitting devices to send their requests.

Each command is initiated by an I/O module (i.e. ballast, MFDEB, LCU, BRCU etc.) requesting permission to transmit the command. TPR frame 2100 uses shorter patterns for addressing, and does not use any code correction. Therefore, more than one transmitter can transmit a request within a time frame. TPR frame 2100 is typically divided into three time slots with different priority: a first slot 2103 with the highest priority, a second slot 2104 with a medium priority, and a third slot 2105 with the lowest priority. Each module that is capable to issue commands gets a new priority through an internal "lottery" at the beginning of a cycle. The priority is determined through a random mechanism, and the transmitters send their requests with a time delay according to their priority. Therefore the probability of two modules having the same priority and desiring to issue commands is very low. Upon receiving the various requests, an Arbiter (preferably the BRCU) "grants permission to transmit" to one of the modules 2107, and that module will issue its command 2108.

Whenever two modules make their request at the same time, there is a possibility that the Arbiter will not be able to make the right decision, so a module that did not get the permission to transmit a command is still pending for transmission, and will make another request (with a new priority lottery) during next cycle. Whenever the Arbiter itself wishes to issue a command, it grants its own address.

There are gaps 2106 after the transmission of the request and after the transmission of the grant signal. Such a gap is necessary to allow decoding and understanding the transmission. Such a gap is not required after command transmission, because this sort of command does not require a response. The benefits of this protocol (which allows collisions between requests) over protocols that allow collisions between commands is that a request message is significantly shorter than a command, thus allowing faster response of the system. In a preferred embodiment, the command length is about 20 ms, while a typical request length is 2 ms. Those skilled in the art will readily recognize that the anti collision protocol embodiment presented herein is a basic structure, and that many variants of this structure are possible and considered within the scope of the present invention.

A preferred alternative embodiment of this protocol is to discard the granting by a central element, and allow each participant to transmit whenever it has a message. If the receiving entity acknowledges the receipt of the message, the loop is closed. If there is no acknowledge by the recipient, the meaning is that a collision has occurred. In this case, each of the transmitting elements are drawing a lot and transmitting in their new time slot. This process repeats itself until all requested messages are satisfied by acknowledge answer of their respective recipients. This preferred embodiment is more agile and translates into significantly shorter time response.

Example of ESLS Application for Building Lighting System

Figure 22:
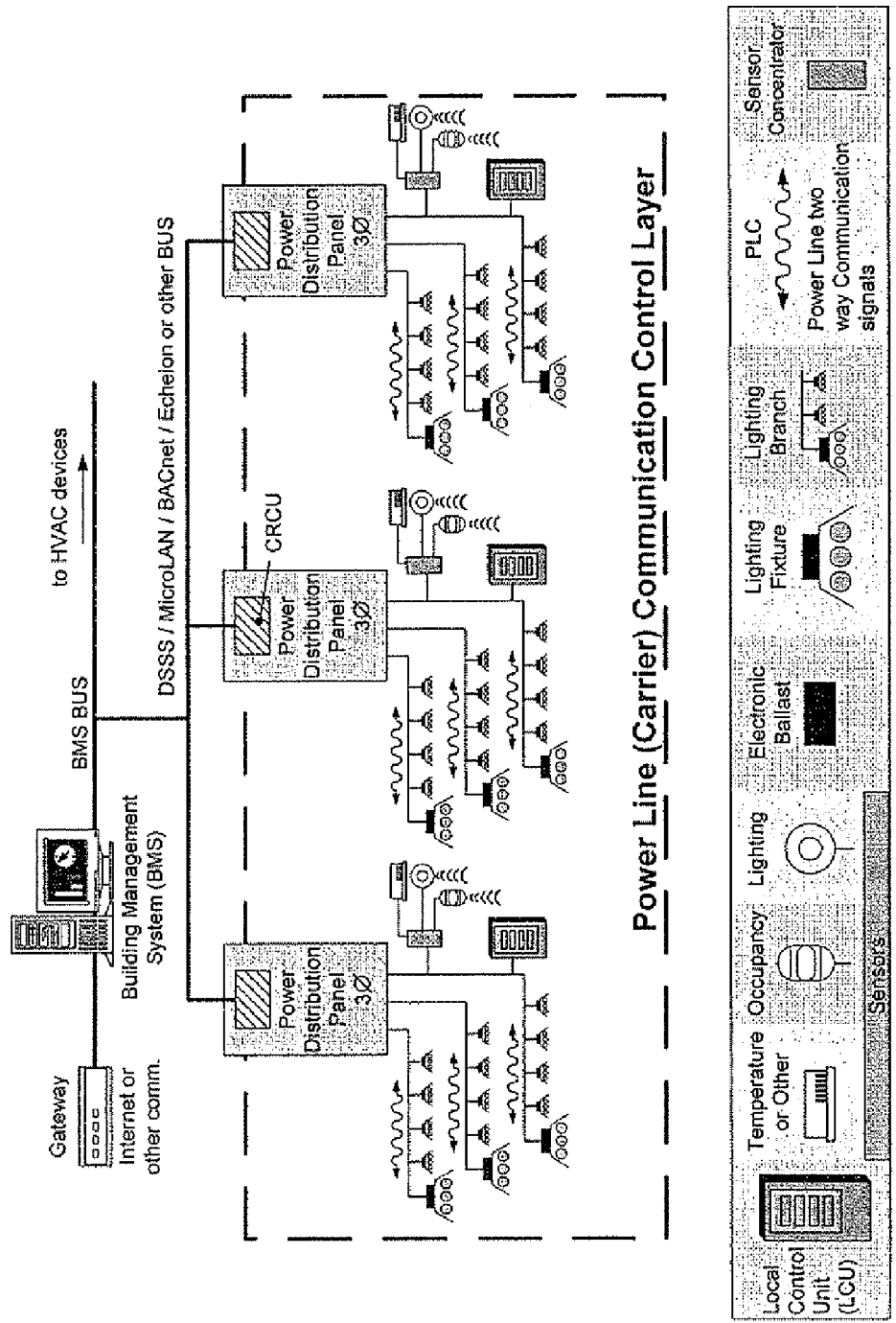
FIG. 22 shows an ESLS System Hierarchy Combining HVAC Management System Sensors & Actuators

The following exemplifies an application of an ESLS with HVAC, LCU, sensing acquisition and actuators. FIG. 22 shows an ESLS System Hierarchy Combining HVAC Management System Sensors & Actuators This system application is based on a two-way DSSS-PLC method, in which the silicon layer (the PLC transceiver modem) is integrated in the IDC. The application includes the anti-collision communication protocol described above, which allows control of a system size of 2048 ballasts and 2048 local controls, actuators and sensors concentrators per CRCU, with a typical execution time of 16 ms and about 150 ms in case of heavy traffic (colliding simultaneous commands). The system was designed to comply with all the standard power line wirings applied in buildings. The following depicts its hierarchical configuration, its principal implementation in the building electrical hardware, and all the components of the system based on the IDC controller.

The system specifications of this application are the result of comprehensive tests performed with real hardware using the reference designs of the ballast and the RCUs operated with the IDC hardware emulators.

Technical Capabilities

The protocol can address up to 2048 ballasts and 2048 sensors concentrators, LCUs, and actuators per CRCU in a multi-branch system of up to 32 branches.

Each power distribution (lighting) panel can include more than one CRCU.

Can contain an unlimited number of power distribution panels.

The ESLS is an open-architecture multi-point system that allows command of each ballast or group of ballasts from several points (LCUs, CRCUs) and from the BMS.

Each LCU can command up to 64 fixtures by user, or automatically from sensor inputs.

Each branch can comprise up to 64 ballasts and up to 64 LCUs and sensor concentrators, and have a total length up to 180 m. All communications within the lighting branch are bi-directional PLC The system has an anti-collision communication protocol with acknowledge that allows each LCU to transmit its command at any time The system components (ballasts, LCU, BRCU and sensors) can log operational parameters information for later retrieval.

The logged information can be transferred to the BMS via the CRCU upon demand, for maintenance or other purposes.

The time response to any command is less than 0.150 sec (typical 0.017 sec).

The communication bit error rate with an error code correction (ERCC) versus SNR for 2000 bit/sec is $10^{-10}$ at 8 db. The command (message) length including ERCC is 32 bits. The net command length is 22 bits.

Can dim or shut down all lamps of each fixture in a multi-fixture configuration, or shut down any lamp in an individual fixture configuration.

Can provide load shedding via the BMS.

Fixed light scenes can be programmed into the system.

User remote control can be performed by RF.

Ballast Self-jamming Noise. In this application, the spurious noise level injected to the branch power line by the ballasts, mainly from its PFC stage, is less than 2 mV rms. This is achieved with a critical mode PFC. This method provides the highest power efficiency and lowest component cost, and generates noise in a relatively large uncontrolled frequency range. The noise generated by this low cost component/count implementation shows in practice a relatively very low interference noise. This performance complies with the most severe requirements of the present application. Nevertheless, the designer could also choose a continuous mode PFC, that will have a constant frequency around 200 KHz, well outside the PLC communication band (95-125 KHz). This solution improves the ballast performance well beyond the system characteristics.

ER of the PLC as of function of S/N. The communication is of 2000 bits/sec, and the protocol includes the ERCC. The transmission is of a 32 bits word constituted of two 16 bit words. Each 16 bit word includes 11 bits of data and 5 bits of ERCC. The ERCC corrects 1 bit error and detects 2 bit errors. At S/N=8 db, the BER is improved by 6 orders of magnitude. When the system encounters two errors, it disregards them, thus the system will send an erroneous command only when a 16 bit word is corrupted by 3 errors. For S/N>8 db, the BER after ERCC is better than $10^{-10}$. The S/N at a ballast located in the extreme of the branch (worst case about 180 meter from the BRCU) is about 10 dB from the BRCU, with a PLC signal transmitted from the BRCU of 2.5 Vrms.

FCC Compliance. The system is compliant with FCC regulation Part 15.107, Part 15.113. The maximum emitted noise at 450 KHz is less than 1 mv (0.43 mV). Calculation: Vref=5V Attenuation=−94.9 db+13.65, db=−81.25 db=0.86E-4, Vref@450 KHz=0.43 mV.

MLB Application Example: 4 Lamps True Parallel MLDEB Features

Brief Description

One Ballast drives 4 Lamps connected in true parallel

Each lamp of the fixture can be remotely commanded On & Off

Each Lamp is PLC addressable

Each Lamp can be switched On or Off individually over the entire dimming range

Stand-by power consumption, lamps off, typical 0.5-0.7 W

Low THD (see previous Electrical Data Table)

Low flicker (see previous Electrical Data Table)

Complete PLC Modem, receives commands, transmits acknowledge and reports ballast and lamps status.

Short Time to Market—Ballast designed for four T8 32 W lamps. Using the PDK tool the ballast can be easily adapted to operate all linear and compact fluorescent lamps in the range of 17-42 W without compromising performance Startup behavior
1. Practically no Glow currents at preheat: <1 mA RMS
2. Starts up at any desirable light level: −1% to 100% without flash
3. Start up at last light level—the ballast remembers its light level at the removal of power and starts up at the same light level when re-powered Light level remotely controlled via PLC communication for each one of the 4 lamps in the fixture Equal light level of all the lamps without using narrow components tolerance Independent protection for each of the lamps If one lamp fails (typical failures) or is shorted or is disconnected or monitored to be EOL (at End Of Life) the ballast will disconnect the failed lamp circuit, continue the normal operation of the other lamps and, on request, will report the failure to the Master control.

Additional protections common to all the operating lamps: Half-bridge Zero voltage switching assurance—shut-down on failure, Ground leakage current protection
DC Bus OVP, Half-bridge overlap protection, PFC switch Current Limit
Lamp Driver Stage 1. The topology used is Half-Bridge with common High side switch and 4 Low side switches. This topology is most economically oriented with the light fixtures controlled individually to a desired light level common to all. In addition, each fixture can be turned on & off individually.
2. Output of each low side switch is fed to a series resonant circuit and each lamp is in parallel with the capacitor of the resonant circuit.
3. The high side and low side switches are separately controlled by 5 drive signals, HSD, LSD1, LSD2, LSD3, LSD4 from the IDC.
4. By using the "Center-tap circuit the switches are zero voltage switched and capacitive load to the half bridge is prevented.

In summary, some state of the art problems of lighting that can be solved using the systems and methods disclosed herein include:

1. Bringing the high voltage to the lamps (in the case the resonant circuit is in the ballast and the lamp fixtures are remote).
2. Transmitting energy in the form of an ultrasonic square wave (in the case the resonant circuit is in the light fixture).
3. Accurate sensing of remote lamps discharge current and voltage.
4. Individual command of the ON, OFF, and light level of each of the fixtures.
5. Individual control of each lamp in each fixture (enough analog inputs and calculating power).
6. Being able to provide the control speed required for the individual light fixtures.
7. Making it all at beneficial cost.

Some of these problems exist also in the case of a single fixture ballast with multiple lamps, and the present invention advantageously provides respective solutions.

To those who are knowledgeable in the art, it should be obvious that a main achievement and advantage of the present invention is that it provides low cost dimmable control of multiple fixtures. Moreover, innovative features in the architectures and systems disclosed contribute to this advantage and achievement. The embodiment of bi-directional communication allows controlling a MFEB or MFDEB by digital external means. The bi-directionality of a system according to the present invention allows to significantly improve the maintainability of the system by facilitating data collection of the ballast, lamp health, and life parameters.

In addition the load on the communication physical layer is substantially lower for an MFDEB network as disclosed herein, than in the case of one ballast per fixture. It is well known by those knowledgeable in the art, that communication quality (S/N) is mainly dependent upon the number of loads (ballasts) and upon the wiring length. Therefore the decrease in the number of ballasts for the same number of fixtures allows a larger lighting system to be served by the same PLC network, or allows a better communication quality for the same number of fixtures. This is true for both PLC and dedicated wire communication.

All publications and patents mentioned in this specification are herein incorporated in their entirety by reference into the specification, to the same extent as if each individual publication or patent was specifically and individually indicated to be incorporated herein by reference. In addition, citation or identification of any reference in this application shall not be construed as an admission that such reference is available as prior art to the present invention.

While the invention has been described with respect to a limited number of embodiments, it will be appreciated that many variations, modifications and other applications of the invention may be made. What has been described above is merely illustrative of the application of the principles of the present invention. Those skilled in the art can implement other arrangements and methods without departing from the spirit and scope of the present invention.

The invention claimed is:

1. A method of detecting an input signal, comprising the steps of:
    a) sampling a plurality N of input signal samples;
    b) detecting a coincidence between the N input signal samples and N corresponding samples of a reference signal; and
    c) generating a 1-bit output value indicative of the coincidence.

2. The method of claim 1, wherein the step of detecting a coincidence includes detecting an absolute coincidence between all the N input signal samples and all the N corresponding reference signal samples.

3. The method of claim 2, wherein the step of generating a 1-bit output value includes generating a positive value indicative of the absolute coincidence.

4. The method of claim 3, wherein detecting an absolute coincidence includes:
    i. providing the N input signal samples to N XOR logic gates,
    ii. providing outputs of the N XOR logic gates to an OR logic gate, and
    iii. generating from the OR logic gate the 1-bit output value.

5. The method of claim 1, further comprising the step of:
    d) integrating the 1-bit output value to obtain an integrated result.

6. The method of claim 5, wherein integrating the 1-bit output value includes increasing an integration result by the 1-bit output value when the 1-bit output value is positive, and decreasing the integration result by the 1-bit output value when the 1-bit output value is negative.

7. The method of claim 6, further comprising the step of:
    e) comparing the integration result with a threshold value.

8. The method of claim 1, wherein the input signal is a Direct Sequence Spread Spectrum (DSSS) modulated signal transmitted over a power line.

9. An apparatus for detecting an input signal, comprising:
    a) a delay line configured to provide a plurality N of input signal samples; and
    b) at least one symbol decoder configured to detect a coincidence between the N input signal samples and N corresponding samples of a reference signal, and to generate a 1-bit value indicative of the coincidence.

10. The apparatus of claim 9, wherein the symbol decoder is configured to detect the coincidence by providing the N input signal samples to N XOR logic gates, by providing outputs of the N XOR logic gates to an OR logic gate, and by generating from the OR logic gate the 1-bit output value.

11. The apparatus of claim 10, wherein the symbol decoder is further configured to integrate the 1-bit output value by increasing an integration result by the 1-bit output value when the 1-bit output value is positive, and by decreasing the integration result by the 1-bit output value when the 1-bit output value is negative.

12. The apparatus of claim 11, further comprising a symbol detector configured to compare the integration result with a symbol threshold.

13. The apparatus of claim 9, wherein the apparatus is configured to be coupled to a power line and wherein the input signal is a Direct Sequence Spread Spectrum modulated signal transmitted over the power line.

* * * * *